(12) United States Patent
Horn et al.

(10) Patent No.: US 10,424,100 B2
(45) Date of Patent: Sep. 24, 2019

(54) ANIMATING THREE-DIMENSIONAL MODELS USING PRESET COMBINATIONS OF ANIMATION FEATURES

(71) Applicant: MICROSOFT TECHNOLOGY LICENSING, LLC, Redmond, WA (US)

(72) Inventors: Stephanie L. Horn, Bellevue, WA (US); Alexandre Gueniot, Mountain View, CA (US); Ramya Tridandapani, Sunnyvale, CA (US); Onur Onder, San Jose, CA (US); Michael Jay Gilmore, Bothell, WA (US); Aimee Leong, Seattle, WA (US); Eric Minghai Gao, Mountain View, CA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 15/820,403

(22) Filed: Nov. 21, 2017

(65) Prior Publication Data

US 2019/0156545 A1    May 23, 2019

(51) Int. Cl.
*G06T 13/20* (2011.01)
*G06F 3/0484* (2013.01)
(Continued)

(52) U.S. Cl.
CPC .......... *G06T 13/20* (2013.01); *G06F 3/04842* (2013.01); *G06F 3/04845* (2013.01);
(Continued)

(58) Field of Classification Search
None
See application file for complete search history.

(56) References Cited

U.S. PATENT DOCUMENTS 6,392,662 B1 * 5/2002 Bou ...................... G06F 3/0481
178/18.01
7,233,326 B1    6/2007 Silva et al.
(Continued)

FOREIGN PATENT DOCUMENTS

EP          2023296 A1    2/2009
WO      2016202024 A1   12/2016

OTHER PUBLICATIONS

"Essential 3D concepts and tools", Retrieved From: <<http://web.archive.org/web/20151117180932/https:/helpx.adobe.com/after-effects/using/effects-animation-presets-overview.htmlhttps:/helpx.adobe.com/after-effects/using/effects-animation-presets-overview.html>>, Retrieved on: Nov. 17, 2015, 10 Pages.
(Continued)

*Primary Examiner* — Jason A Pringle-Parker
(74) *Attorney, Agent, or Firm* — Newport IP, LLC; Mike R. Cicero

(57) ABSTRACT

An animation preset graphical user interface (GUI) enables users to select a 3D model of an object and to further select between multiple animation presets that each individually cause a 3D animation engine to apply combinations of animation features against the 3D model. An exemplary animation preset may cause the object to translate across a display area (e.g., move from left to right across screen) while simultaneously rotating against a rotational axis (e.g., spinning so that different surfaces of the object become more prominent). The animation preset GUI may enable the user to dynamically toggle through different intensity levels to cause a selected animation preset to be rendered in accordance with different acceleration parameters and/or magnitude parameters. The animation preset GUI may enable the user to dynamically toggle between predefined animation spaces for animating the object. Animation-parameters may
(Continued)

be persisted to a file to enable future editing of the animations.

20 Claims, 18 Drawing Sheets

(51) Int. Cl.
  *G06T 19/20* (2011.01)
  *G06F 17/50* (2006.01)
(52) U.S. Cl.
  CPC .............. *G06T 19/20* (2013.01); *G06F 17/50* (2013.01); *G06T 2219/2012* (2013.01); *G06T 2219/2016* (2013.01)

(56) References Cited

U.S. PATENT DOCUMENTS

| | | | |
|---|---|---|---|
| 7,336,264 B2 | 2/2008 | Cajolet et al. | |
| 7,559,034 B1 * | 7/2009 | Paperny | G06F 9/44526 345/629 |
| 9,305,385 B2 | 4/2016 | Maloney et al. | |
| 9,805,491 B2 | 10/2017 | Herman et al. | |
| 2001/0033296 A1 * | 10/2001 | Fullerton | G06F 17/30017 715/730 |
| 2006/0227142 A1 * | 10/2006 | Brown | G06F 17/211 345/473 |
| 2006/0277481 A1 * | 12/2006 | Forstall | G06F 16/957 715/764 |
| 2007/0262996 A1 * | 11/2007 | Fernandez | G06T 13/00 345/473 |
| 2008/0307308 A1 * | 12/2008 | Sullivan | G06F 16/9577 715/723 |
| 2009/0119597 A1 * | 5/2009 | Vaughan | G06T 13/80 715/732 |
| 2011/0066495 A1 * | 3/2011 | Ayloo | G06Q 30/02 705/14.53 |
| 2013/0132840 A1 * | 5/2013 | Blas, Jr. | G06T 13/00 715/719 |
| 2015/0331970 A1 | 11/2015 | Jovanovic | |

OTHER PUBLICATIONS

Jason, "Layer Animations & Timeline", Retrieved From: <<https://www.themepunch.com/revslider-doc/layer-animations-timeline/>>, Retrieved on: Mar. 15, 2016, 22 Pages.

"International Search Report and Written Opinion Issued in PCT Application No. PCT/US2018/059919", dated Apr. 18, 2019, 19 Pages.

* cited by examiner

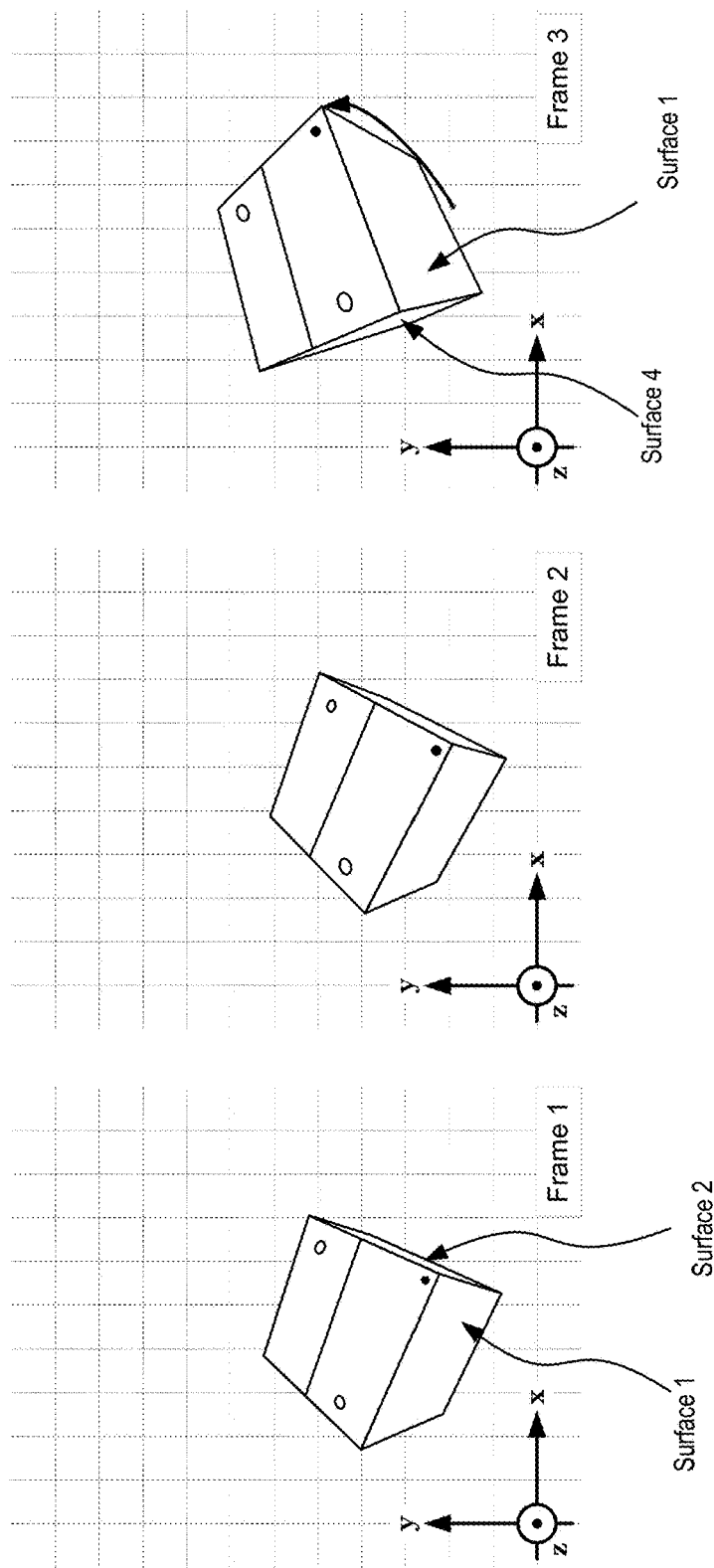

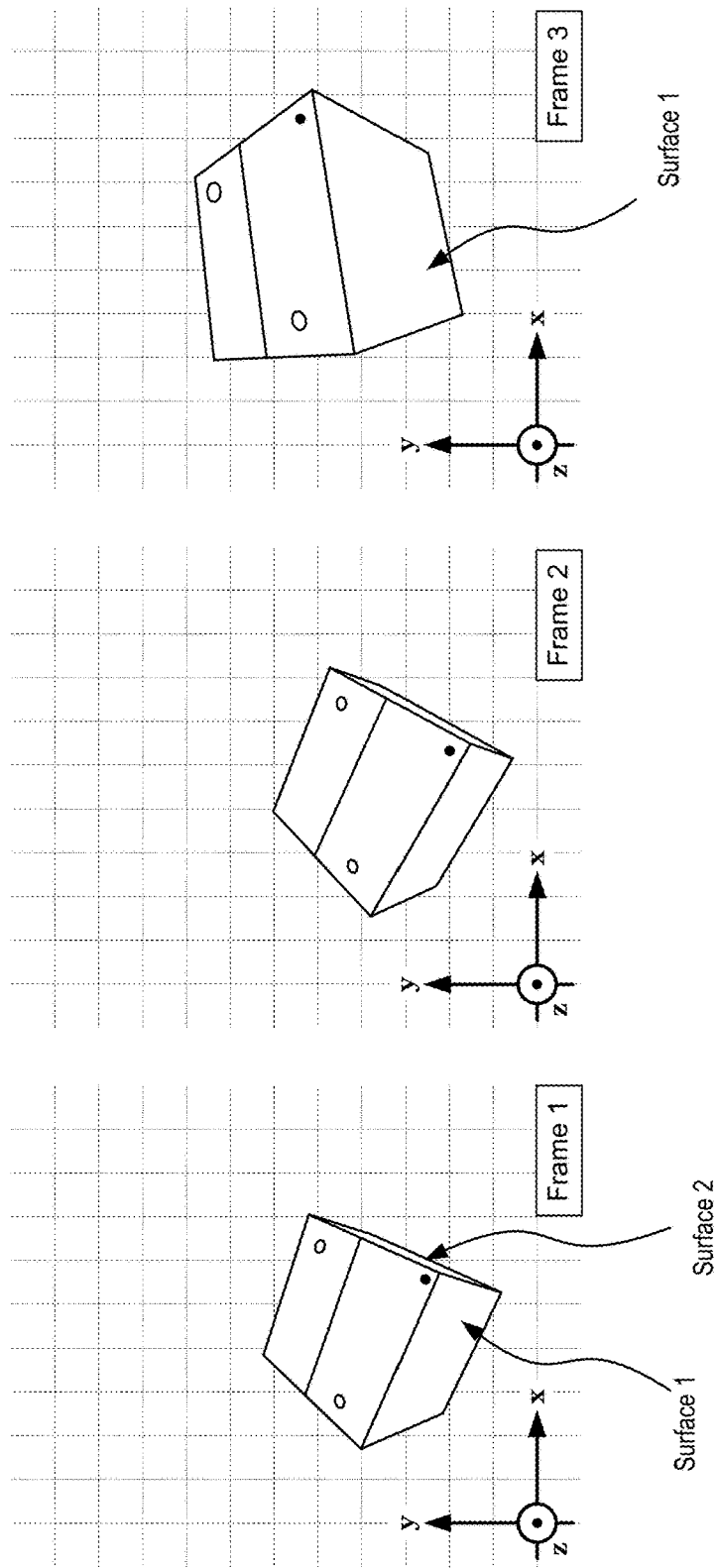

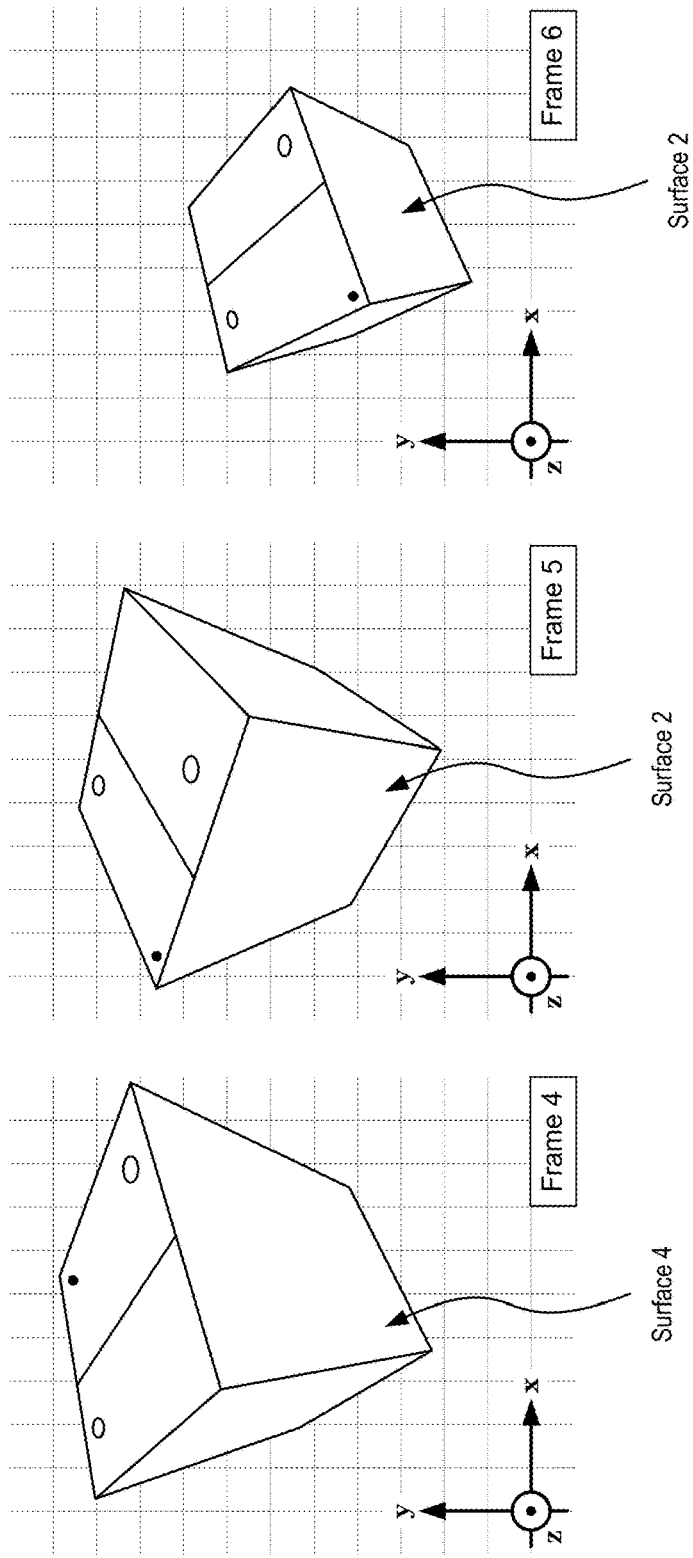

ANIMATING THREE-DIMENSIONAL MODELS USING PRESET COMBINATIONS OF ANIMATION FEATURES

BACKGROUND

Advances in Computer-Aided Design (CAD) applications over the last several decades have revolutionized the engineering industry. For example, engineers today leverage CAD applications to generate three-dimensional ("3D") models of discrete parts and even complex assemblies which can be digitally rendered to convey information faster and more accurately than through conventional two-dimensional ("2D") technical drawings. Some powerful CAD applications even enable engineers to animate 3D models by defining functional relationships between sub-objects (e.g., surfaces, solid revolves, solid embossments, etc.) of the 3D models and/or reference systems existing within a 3D modeling environment. Unfortunately, defining such functional relationships generally requires a deep understanding of how specific sub-objects and/or reference systems of the 3D models are mathematically defined (e.g., using a parametric modeling scheme) in whichever CAD application was used to generate the 3D model being animated.

Therefore, animating 3D models typically requires a highly specific skill set that is only gained through experience using these powerful CAD applications. Because some CAD applications are costly to obtain and cumbersome to learn, their use remains a very niche space such that only a relatively small portion of the overall population is capable of animating 3D models. Furthermore, some 3D animation technologies are limited to generating animations within the same CAD application used to create a 3D model. Although these animations can be recorded and saved as video files (e.g., an AVI file) to embed into a 2D workspace (e.g., a slide-deck type presentation), the output video files are static and cannot be dynamically modified within the 2D workspace. It is with respect to these and other considerations that the disclosure made herein is presented.

SUMMARY

Technologies described herein enable a user to quickly and seamlessly animate an object by selecting between animation presets that define combinations of animation features to render against a three-dimensional ("3D") model of the object. Embodiments described herein display an animation preset graphical user interface (GUI) for enabling users to select a 3D model of the object and to further select between multiple animation presets that each individually cause a 3D animation engine to apply combinations of animation features against the 3D model. For example, a user may select an individual animation preset to seamlessly cause the object to translate across a display area (e.g., move from left to right across a screen) while simultaneously rotating against a rotational axis (e.g., spinning so that different surfaces of the object become more prominent). In some embodiments, the animation preset GUI may further enable the user to select an intensity level from a set of intensity level presets and apply the selected intensity level to a selected animation preset. Exemplary intensity levels define acceleration parameters and/or magnitude parameters with which to render selected animation presets when animating the object. For example, applying a first intensity level to a selected animation preset may cause the object to accelerate slowly and translate across a small portion of a display area, whereas applying a second intensity level to the same selected animation preset may cause the object to accelerate quickly and translate across a larger portion of the same display area.

The disclosed technologies thus provide benefits over existing 3D animation techniques which require users to manually define parameters of each individual animation feature to be applied when rendering an animation. For example, since various implementations of the disclosed techniques do not require users to define functional relationships between sub-objects of the 3D models, these techniques enable users with little or no CAD experience to quickly and efficiently apply animation presets to selected 3D models. More specifically, because the disclosed techniques facilitate the abstracting of complex geometrical and mathematical relationships (e.g., between objects and reference coordinate systems) that underlie complex animations, users need not define or even understand these underlying relationships to generate animations in accordance with the disclosed techniques.

In some implementations, the animation features that can be applied against the 3D model include an opacity animation feature that causes an opacity of the rendered object to increase or decrease over time. For example, an animation preset may be designed to visually increase (or decrease) a conspicuousness (e.g., visibility and/or observability) of the object by increasing (or decreasing) an opacity at which the object is rendered. As a more specific example, an animation preset may sequentially adjust the opacity of the rendered object from substantially or fully transparent to fully opaque. In some implementations, the animation features that can be applied against the 3D model include a rotation animation feature that causes an orientation of the object to change over time. For example, an animation preset may be designed to draw viewers' attention to the object by moderately rotating the object's orientation by a predetermined number of degrees about a predetermined axis (e.g., to render an eye grabbing motion effect). As another example, an animation preset may be designed to show all sides of an object over time by fully rotating the object a predetermined number of times about a predetermined axis. In some implementations, the animation features that can be applied against the 3D model include a translation animation feature that causes a position of the rendered object to change over time. For example, an animation preset may be designed to cause the object to move in a predetermined direction in reference to a predetermined coordinate system.

In some implementations, a translation animation feature may cause a size at which the object is rendered to change over time. For example, an animation preset may be designed to provide the impression that the object is moving in a direction that is non-planar with a display surface on which the object is being rendered (e.g., a computer monitor and/or projector screen). Under these circumstances, if the direction of translation is toward viewers (e.g., "out of the page") then the rendered size of the object may increase over time whereas if the direction of translation is away from viewers (e.g., "into the page") then the rendered size of the object may decrease over time. It can be appreciated that increasing, or decreasing, the rendered size of the object over time may be designed to impart to viewers the impression that the object is becoming closer, or farther away, respectively from the viewer.

In some implementations, the animation features that can be applied against the 3D model include a deformation animation feature that causes an exterior shape of the rendered object to change over time. For example, the deformation animation feature may be designed to dynamically modify an outer shape and/or a scale of the rendered object to compress and/or stretch the rendered object along a predetermined axis. As another example, the deformation animation feature may be designed to centrifugally elongate the rendered object away from a predetermined axis (e.g., stretching the rendered object away from an axis in a manner similar to how a non-rigid body such as, for example, spinning pizza dough stretches away from an axis of rotation due to centrifugal forces). As described in more detail below, the deformation feature may be utilized in various animation presets to achieve a life-like and/or cartoon-like effects such as, for example, a "jump and turn" animation preset that compresses the rendered object along a translation axis and then "releases" the compression as the translation begins. This combination of animation features may achieve the appearance that the object squatted down in order to jump upward. It can be appreciated that various animation presets such as, for example, the "jump and turn" animation preset may be deployed to personify and/or draw attention to the rendering of the object within a presentation space.

As used herein, deploying the deformation animation feature to deform a model may include changing an exterior shape of the object in a manner than affects relative proportions of one or more portions of the object. As used herein, deploying the deformation animation feature to deform a model may also include adjusting a size of the model by scaling a size of the model to proportionally increase and/or decrease the size of the model.

As used herein, the term "animation feature" may refer generally to a functionality that causes a sequential series of frame-to-frame adjustments to the 3D rendering of the object. For example, if an animation preset is designed to animate the object rotating a predetermined number of degrees about a selected axis, then a corresponding rotation animation feature may determine a frame-to-frame adjustment sequence that defines multiple discrete rotational orientations to sequentially render to give the appearance of rotational velocity and/or rotational acceleration.

In some implementations, an application facilitates compositing 3D animations onto a two-dimensional ("2D") work page of a document. The application may receive document data that defines multiple 2D work pages of the document. In a specific but non-limiting example, the application is a presentation application (e.g., APPLE KEYNOTE, GOOGLE SLIDES, MICROSOFT POWERPOINT, etc.) that is configured to facilitate editing and presenting multiple 2D work pages (e.g., slides). The application may display the animation preset GUI in association with an individual 2D work page to enable the user to select an animation preset for superimposing an animation of an object over the individual 2D work page. The application may receive a user input that indicates a location on the individual 2D work page to animate the object. Then, in response to the user input that indicates the location, the application may superimpose a 3D scene box onto the individual 2D work page at the location defined by the user. In some embodiments, the user may dynamically relocate the 3D scene box on the 2D work page to alter where the object is animated in relation to other objects (e.g., other 3D animations, text boxes, etc.) on the 2D work page. For example, the user may click-and-hold the 3D scene box (e.g., with a mouse curser) and dynamically drag the 3D scene box closer to, or even over, a 2D text box object. In some embodiments, the user may define layer parameters that indicate a layering order for the 3D scene box with respect to the other objects on the 2D work page. For example, the user may indicate whether the animation of the object should block text characters within the 2D text box object (e.g., to animate the object over the text characters) or whether the text characters should remain visible over the animation of the object (e.g., to animate the object behind the text characters).

In some implementations, the animation preset GUI enables the user to select between predefined animation spaces for animating the object. For example, consider a scenario in which a user has selected an animation preset that combines: (i) a rotational-acceleration animation feature that causes the object to smoothly accelerate about a Z-axis until reaching a predetermined angular-velocity, with (ii) a rotational-deceleration animation feature that causes the object to smoothly decelerate from the predetermined angular-velocity until reaching an angular-velocity of zero (e.g., stopping about the Z-axis). Now, suppose that the animation preset has been applied to the object in association with a 3D scene box that is superimposed onto a 2D work page defining a global coordinate system. Further suppose that a local coordinate system is defined within the object data defining the 3D model of the object and that a local Z-axis of the local coordinate system is not aligned with a global Z-axis of the global coordinate system. Under these specific but non-limiting circumstances, embodiments described herein enable a user to dynamically change the animation space so that the object switches between rotating about the local Z-axis and global Z-axis. The foregoing example will be described in more detail with relation to FIGS. 3A and 3B.

It should be appreciated that the described subject matter may be implemented as a computer-controlled apparatus, a computer process, a computing system, or as an article of manufacture such as a computer-readable storage medium. Among many other benefits, the techniques disclosed herein improve efficiencies with respect to a wide range of computing resources. For instance, by predefining animation presets that include complex combinations of multiple animation features, the disclosed techniques reduce the number of manual user input steps required to assign these complex combinations of multiple animation features to animation scenes. As each such manual user input step necessarily requires numerous processing cycles that are ancillary to the actual assigning of animation features to animation scenes (e.g., processing steps required at least to alter a graphical user interface as the user progresses through the manual user input steps), implementing the disclosed techniques substantially reduces the number of processing steps needed to render powerful animation scenes. In addition, improved human interaction can be achieved by the introduction of more accurate and faster completion of such tasks. Other technical effects other than those mentioned herein can also be realized from implementations of the technologies disclosed herein.

This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The Detailed Description is described with reference to the accompanying figures. In the figures, the left-most digit(s) of a reference number identifies the figure in which the reference number first appears. The same reference numbers in different figures indicate similar or identical items.

FIGS. 8A through 8C (collectively referred to as FIG. 8) illustrate a frame sequence for an exemplary animation preset that combines a deformation animation feature, a translation animation feature, and a rotation animation feature.

FIGS. 9A through 9C (collectively referred to as FIG. 9) illustrate a frame sequence for the exemplary animation preset of FIG. 8 with the exception that an intensity level preset has been modified to increase magnitude parameters and/or acceleration parameters for rendering the exemplary animation preset of FIG. 8.

DETAILED DESCRIPTION

The following Detailed Description describes technologies that enable a user to quickly and seamlessly animate an object by selecting between animation presets defining combinations of animation features to render against a three-dimensional ("3D") model of the object. Generally described, some embodiments display an animation preset graphical user interface (GUI) for enabling users to select a 3D model and to further select between multiple animation presets that each individually cause a 3D animation engine to apply combinations of animation features against the 3D model. For example, a user may select an individual animation preset to seamlessly cause the object to translate across a display area (e.g., move from left to right across a screen) while simultaneously rotating about a rotational axis (e.g., spinning so that different surfaces of the object become more prominent). The animation preset GUI may further enable the user to dynamically toggle through different intensity level presets to cause a selected animation preset to be rendered in accordance with different acceleration parameters (e.g., to make a rendering appear "quicker") and/or magnitude parameters (e.g., to make a rendering appear "larger" or "faster"). Furthermore, the animation preset GUI may enable the user to dynamically toggle between predefined animation spaces for animating the object. For example, the user may quickly change a selected animation preset from being applied in a "Viewing Space" (e.g., as defined by a global coordinate system of an application) versus an "Object Space" (e.g., as defined by a local coordinate system of a 3D model).

The disclosed techniques are believed to be applicable to a variety of computing application types that involve rendering animations of 3D objects. Aspects of the techniques disclosed below are described in the context of a "presentation application" that is configured to facilitate editing and presenting multiple two-dimensional ("2D") work pages (e.g., slides). While the scope of the disclosed techniques is not necessarily limited to presentation applications, an appreciation of various aspects of the disclosed techniques is readily gained through a discussion of examples that are described with respect to such applications. Various aspects of the disclosed techniques are, however, widely applicable to other computing application types such as, for example, word processing applications (e.g., GOOGLE DOCS, MICROSOFT WORD, etc.), spreadsheet applications (e.g., GOOGLE SHEETS, MICROSOFT EXCEL, etc.), Computer-Aided Design (CAD) applications (e.g., SOLID WORKS, PTC CREO ELEMENTS/PRO, MICROSOFT PAINT 3D, etc.), and any other type of computing application suitable for deploying animation presets against 3D models of objects.

Figure 1:
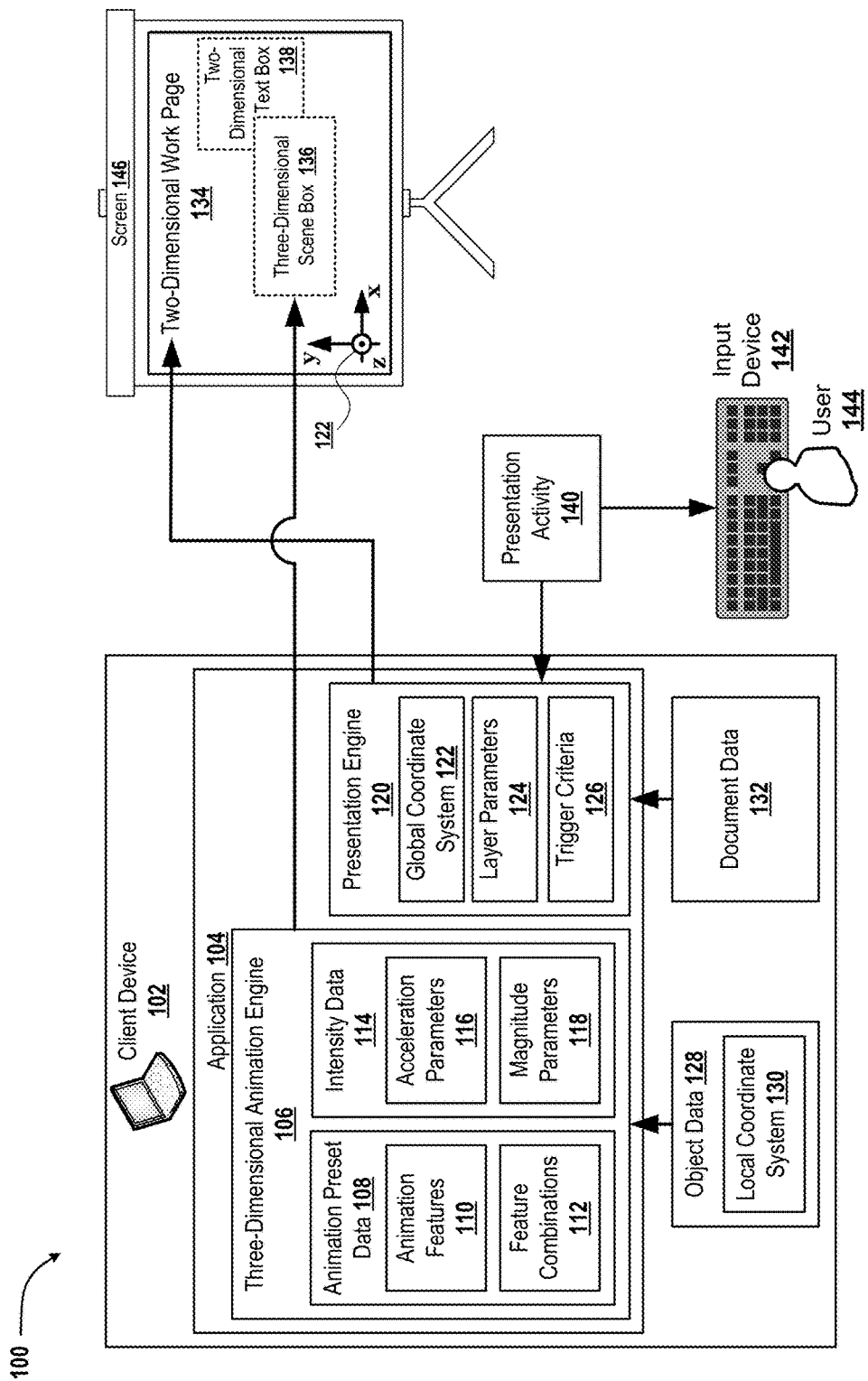
FIG. 1 illustrates an exemplary system for enabling a user of a client device to quickly and seamlessly animate an object by selecting between animation presets that define combinations of animation features to render against a three-dimensional ("3D") model of the object.

Turning now to FIG. 1, illustrated is an exemplary system 100 for enabling a user of a client device 102 to quickly and seamlessly animate an object by selecting between animation presets that each define combinations of animation features to render against a three-dimensional ("3D") model of the object. As illustrated, the client device 102 may include an application 104 that is executable by an operating system of the client device 102. For example, the application 104 may be a client application (e.g., POWERPOINT and/or WORD by MICROSOFT, KEYNOTE and/or PAGES by APPLE, INC., SOLID WORKS by DASSAULT SYSTEMES) that is installed onto the client device 102 and can be run at the client device 102 by the operating system. As another example, the application 104 may be a server application (e.g., GOOGLE DOCS and/or GOOGLE SLIDES) that is accessible at the client device 102 via a web portal (not shown). Although illustrated as a "laptop" style computing device, the client device 102 may be any other suitable computing device such as, for example, a desktop computer, a tablet computer, a smart phone, etc.

In some embodiments, the application 104 may include a three-dimensional ("3D") animation engine 106 for rendering combinations of animation features against 3D models of an object. The 3D animation engine 106 may receive a selection of object data 128 that defines a 3D model of the object of interest. Exemplary object data 128 may include, but is not limited to, STEP files (i.e., 3D model files formatted according to the "Standard for the Exchange of Product Data"), IGES files (i.e., 3D model files formatted according to the "Initial Graphics Exchange Format"), glTF files (i.e., 3D model files formatted according to the "GL Transmission Format"), and/or any other suitable format for defining 3D models. In various embodiments, the object data 128 may define at least one local coordinate system 130. For example, the object data 128 may define a default coordinate system that includes default X, Y, and Z (geometric) planes and further includes default X, Y, and Z axes (e.g., defined by intersections of the default planes). As used herein, the term "local coordinate system" may refer generally to any coordinate system that is defined within a 3D model of an object and/or used as a reference within the 3D model to locate and/or orient the object and/or one or more sub-objects (e.g., surfaces, solid revolves, solid embossments, etc.) of the object.

The 3D animation engine 106 may include animation preset data 108 that defines multiple animation presets that can be applied to the object data 128 to animate an object of interest (e.g., a car, a box, a helicopter, a pencil, or any other 3D object). For example, a first animation preset may cause the object to rotate from a first orientation to a second orientation while also changing from being rendered as substantially transparent (e.g., such that the object appears faint) to being rendered as fully opaque (e.g., such that the object appears vivid).

The animation preset data 108 may define animation features 110 that can be applied individually or in combination to "animate" the object by causing a sequential series of frame-to-frame adjustments to a rendering of the object.

The animation features 110 may include an opacity animation feature that causes an opacity of the rendered object to increase or decrease over time. For example, the opacity animation feature may be designed to increase (or decrease) an opacity at which the object is rendered to increase (or decrease) how vivid the object appears to a viewer of an animation preset.

The animation features 110 may include a rotation animation feature that causes an orientation of the rendered object to change over time. For example, the rotation animation feature may be designed to rotate the object about one or more selected axes over time. In some implementations, a selected axis may pass through a centroid of the object such that the object's position in space remains static while the object rotates about the selected axis. In some implementations, a selected axis may be offset from a centroid of the object such that the object's position in space orbits around the selected axis while the object rotates about the selected axis. The term "orientation" is used herein in the geometrical sense to refer to an angular position or attitude of an object's placement in a space (e.g., as opposed to a translational position of the object's centroid).

The animation features 110 may include a translation animation feature that causes a position of the rendered object (e.g., as measured from a centroid of the object and/or any other suitable point-of-reference) to change over time. For example, the translation animation feature may be designed to move every point of the rendered object by the same amount in a specified direction (i.e., assuming the rendered object is not simultaneously rotating in space). In some implementations, the translation animation feature may dynamically alter a size at which the object is rendered to indicate whether the object is translating toward a viewer or away from a viewer. In particular, the rendered size of the object (e.g., the percentage of a display area that the rendering takes up) may increase to impart to viewers the impression that the object is becoming closer or, in the alternative, decrease to impart to viewers the impression that the object is becoming farther away.

The animation features 110 may include a deformation animation feature that causes an exterior shape of the rendered object to change over time. For example, the deformation animation feature may be designed to compress and/or stretch the rendered object along a predetermined axis. As another example, the deformation animation feature may be designed to centrifugally elongate the rendered object away from a predetermined axis (e.g., stretching the rendered object away from an axis in a manner similar to how a non-rigid body such as, for example, spinning pizza dough stretches away from an axis of rotation due to centrifugal forces).

In various implementations, the animation features 110 may further include an acceleration animation feature and/or deceleration animation feature that can be applied in conjunction with one or more of the rotation animation feature and/or translation animation feature. For example, rather than rendering an object as immediately changing from a static position to a specified velocity across a scene (which may appear unnatural as the velocity of a real-life object will change through periods of acceleration and/or deceleration), an acceleration animation feature may be applied in conjunction with a translation animation feature to cause the rendered object to accelerate up to the specified velocity.

The animation preset data 108 may define feature combinations 112 that are predetermined combinations of the animation features 110. For example, as described in more detail below with reference to FIGS. 8A through 9C, the deformation animation feature may be deployed in conjunction with the translation animation feature to compress the rendered object and then to decompress the rendered object just prior to translating the object upward. It will be appreciated that one or more feature combinations 112 may be used in various animation presets to render "life-like" actions such as, for example, making the rendered object appear to playfully jump upward and spin. As another example, a feature combination 112 may cause an object to be animated as rotationally accelerating about a selected axis from an angular velocity of zero up to a predetermined angular velocity before rotationally decelerating about the selected axis back to the angular velocity of zero. Specific examples of individual animation presets as defined by various individual feature combinations 112 will be described in more detail below with respect to FIGS. 5 through 10.

The 3D animation engine 106 may further include intensity data 114 that defines one or more sets of intensity level presets that indicate degrees (e.g., of acceleration and/or magnitude) to which various animation features 110 and/or feature combinations 112 are rendered when animating an object in accordance with a selected animation preset. In some embodiments, the intensity data 114 includes acceleration parameters 116 that define the rate at which an opacity, deformation, and/or velocity (angular and/or translational) of the rendered object changes over time. For example, consider a scenario in which a selected animation preset causes the rendered object to rotate three-hundred-and-sixty ("360") degrees about a predetermined axis. Under these circumstances, a first intensity level may cause the selected animation preset to occur sluggishly (e.g., in 5 seconds) whereas a second intensity level may cause the same selected animation preset to occur relatively more quickly (e.g., in 1 second). In some embodiments, the intensity data 114 includes magnitude parameters 118 that define a degree to which an opacity, deformation, velocity (angular and/or translational), orientation (e.g., attitude in space), and/or position of the object changes during the course of a selected animation preset. For example, consider a scenario in which a selected animation preset causes the rendered object to rotate about a predetermined axis while translating in a predetermined direction. Under these circumstances, a first intensity level may be applied to the selected animation preset to cause the rendered object to rotate about the predetermined axis a single time while translating in the predetermined direction a particular distance (e.g., X) whereas a second intensity level may be applied to the same selected animation preset to cause the rendered object to rotate about the predetermined axis multiple times while translating in the predetermined direction a relatively farther distance (e.g., 3X).

In some embodiments, the application 104 may include a presentation engine 120 configured to display various work spaces in which the 3D animation engine 106 may render animations of the object. Exemplary work spaces include two-dimensional ("2D") work pages 134 (e.g., slides of a presentation document, pages of a word processing document, sheets of a spreadsheet document, etc.) and/or 3D work spaces (e.g., volumes of space defined by a CAD application). The presentation engine 120 may determine definitions for a global coordinate system 122 that corresponds to one or more work spaces. For example, in the illustrated implementation in which the work space is a 2D work page 134, the global coordinate system 122 may include a global Z-plane that is co-planar with the 2D work page 134, a global Y-plane defining a vertical direction on the 2D work page 134, and a global X-plane defining a horizontal direction on the 2D work page 134. Thus, in FIG. 1, the global coordinate system 122 is represented both within the presentation engine 120 and also superimposed on the 2D work page 134. As used herein, the term "global coordinate system" may refer generally to a coordinate system that is defined with reference to a work space of the application 104. In some implementations, the global coordinate system 122 may be defined by the document data 132. In various implementations, the disclosed techniques enable a user 144 to toggle between a selected animation preset being rendered against a "Viewing Space" defined by the global coordinate system 122 versus an "Object Space" defined by the local coordinate system 130.

In some implementations, the 3D animation engine 106 is configured to locate a 3D scene box(es) 136 within a workspace and, ultimately, to render animations in accordance with a selected animation preset within the 3D scene box(es) 136. For example, in an implementation in which the workspace is a 2D work page 134, the 3D animation engine 106 may locate a 3D scene box 136 in the 2D work page 134. In various implementations, the 3D animation engine 106 may locate the 3D scene box 136 within the workspace with reference to the global coordinate system 122. Furthermore, the techniques described herein may enable the user 144 to locate and/or relocate the 3D scene box 136 with respect to one or more other objects (e.g., other 3D objects and/or 2D objects such as text and/or graphics) within the workspace. For example, as illustrated, the 3D scene box 136 has been positioned within the 2D work page 134 to at least partially overlap with another object. More specifically, the 3D scene box 136 has been positioned to overlap with a 2D text box 138 in which the user can add and/or edit text to be displayed on the 2D work page 134. In some implementations, the presentation engine 120 may include layer parameters 124 that indicate a layering order for the 3D scene box 136 with respect to the other objects on the 2D work page 134. For example, the layer parameters 124 may indicate whether the animation of the object should block text characters of the 2D text box 138 (e.g., to animate the object over the text characters) or whether the text characters should remain visible over the animation of the object (e.g., to animate the object behind the text characters). As illustrated, the layer parameters 124 are causing the 3D scene box 136 to be positioned over the top of the 2D text box 138.

In some embodiments, the presentation engine 120 may enable a user to define trigger criteria 126 associated with triggering display of a rendering of the object in accordance with a selected animation preset. For example, a user may select object data 128 defining the 3D model of the object of interest and may also select a specific animation preset for animating the object. Then, the user may define one or more specific triggers for causing the object of interest to be animated in accordance with the selected animation preset. Exemplary triggers include, but are not limited to, a user clicking on a 3D scene box 136, a user double clicking on a 3D scene box 136, a predetermined time passing from the 2D work page 134 being initially shown during a "presenting mode" of the application 104, or any other event that is discernable by the application 104 for triggering the 3D animation engine 106 to render an animation of a 3D model of an object.

Once trigger criteria 126 have been defined for a selected animation preset, the application 104 may monitor presentation activity 140 to determine when trigger criteria 126 for the selected animation preset have been satisfied. Then, upon the trigger criteria 126 being satisfied, the application 104 may deploy the 3D animation engine 106 to animate the object in accordance with the triggered animation preset.

In some implementations, the trigger criteria 126 may define multiple triggers to dynamically vary animations based on the presentation activity 140. For example, a user may define first trigger criteria for triggering an object of interest to be animated in accordance with a first animation preset and may further define second trigger criteria for triggering the object of interest to be animated in accordance with a second animation preset. In some implementations, the trigger criteria 126 may define multiple triggers to dynamically vary in intensity level of a selected animation based on the presentation activity 140. For example, consider a scenario in which a 3D scene box 136 is generated to animate an object of interest in accordance with an animation preset that renders the object of interest jumping up and spinning before returning to a starting point (e.g., as described in more detail below with reference to FIGS. 8A through 9C). Under these circumstances, a user may define first trigger criteria for triggering the animation at a first intensity level and may further define second trigger criteria for triggering the animation at a second intensity level. Then, while presenting the document data 132 the user 144 may decide on the fly whether to perform the first trigger criteria (e.g., hitting a first button on an input device 142) to trigger the animation at the first intensity level or to perform the second trigger criteria (e.g., hitting a second button on the input device 142) to trigger the animation at the second intensity level.

In the illustrated example, the application 104 is shown to render the work space on a screen 146 for showing graphics that are projected from a projector type display. However, any other suitable display (e.g., a computer monitor, a television, a 3D television, etc.) can be used.

Figure 2:
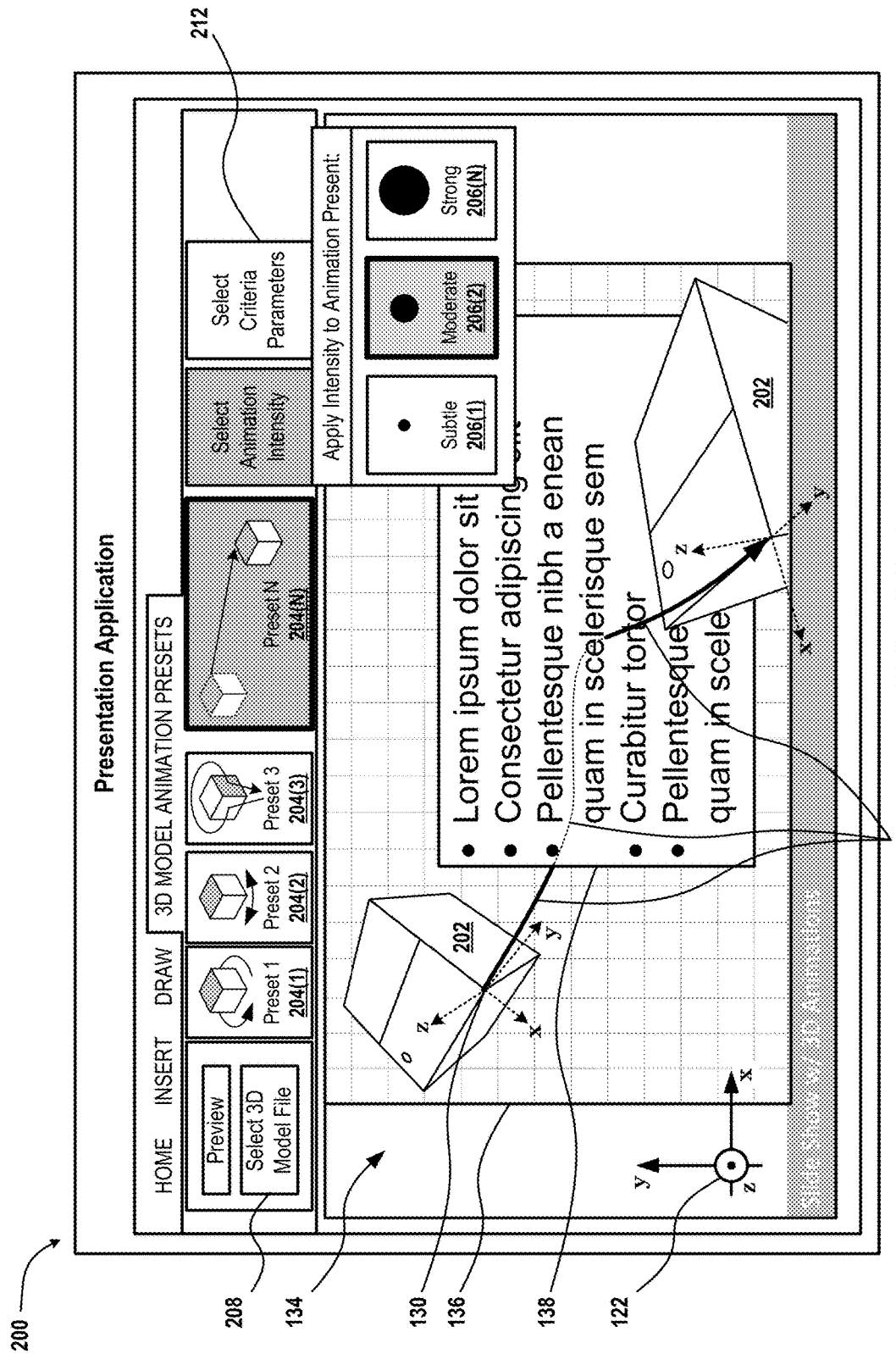
FIG. 2 illustrates an exemplary animation preset graphical user interface (GUI) that enables a user to dynamically adjust animations of an object by selecting from multiple animation presets and/or intensity level presets.

Turning now to FIG. 2, illustrated is an exemplary animation preset graphical user interface (GUI) 200 that enables a user to dynamically adjust animations of an object 202 by selecting from multiple animation presets 204 and/or intensity level presets 206. As illustrated, the animation preset GUI 200 shows a first animation preset 204(1) through an N-th animation preset 204(N) along with icons to graphically indicate how each animation preset animates selected objects. For example, the first animation preset 204(1) includes an icon to graphically indicate that this animation preset renders objects performing full rotations about an axis. Furthermore, the second animation preset 204(2) includes an icon to graphically indicate that this animation preset renders objects rotating back and forth about an axis. In some implementations, once the user has selected one of the animation presets 204, the user may then select an axis of rotation and/or direction of translation.

The animation preset GUI 200 also includes a first intensity level preset 206(1) through an N-th intensity level preset 206(N). More specifically, the animation preset GUI 200 enables the user to quickly change an intensity level for a "selected" animation preset between a "subtle" intensity level, a "moderate" intensity level, and a "strong" intensity level. It can be appreciated, therefore, that in some embodiments the various intensity level presets do not numerically convey (i.e., graphically to the user) integer values for the acceleration parameters 116 and/or magnitude parameters 118. Rather, in some embodiments, the various intensity level presets abstractly convey how "intensely" a selected intensity level preset will cause an animation to be rendered.

In some implementations, the layer parameters 124 may define a plane of intersection between the 3D scene box 136 and the 2D text box 138 to enable the 3D animation engine 106 to render certain portions of a selected animation preset behind contents of the 2D text box 138 (e.g., text characters) and to render other portions of the selected animation preset in front of contents of the 2D text box 138. For example, as illustrated, the object 202 is shown to fly along a path 210 that results in the object first flying from the side of the 2D text box 138 to behind the 2D text box 138 and then through the 2D text box 138 and ultimately "off-the-page." More specifically, the selected animation preset of FIG. 2 causes the object 202 to fly along a path 210 such that the object is visible when at segments along the path 210 that are solid lines but not visible when at segments along the path 210 that are dashed lines. In some implementations, the 2D text box 138 may include "fill" such that the object 202 is completely blocked by the 2D text box 138 regardless of the text characters within the 2D text box 138. For example, a user may apply a white background to the 2D text box 138. In some implementations, the 2D text box 138 may be "unfilled" such that the portions of the object 202 that are behind the 2D text box 138 are only blocked from visibility if directly behind text characters within the 2D text box 138.

In some implementations, various animation presets may cause the object 202 to translate (e.g., move, travel, change position) across a work space along a straight line (e.g., a path defined by a single vector that indicates both direction and distance). In some implementations, such as that illustrated in FIG. 2, various animation presets may cause the object 202 to translate across a work space along a nonlinear path (e.g., a path defined by a spline curve connecting two or more points).

As shown, the animation preset GUI 200 includes a file selection button 208 to enable a user to select the object data 128. In various implementations, the file selection button 208 enables a user to swap out object data 128 even after the selected animation has been defined. For example, in the illustrated example, a user has located 3D scene box 136 on a 2D work page 134 and has associated first object data 128(1) defining a first object with the 3D scene box 136. The user has further selected a selected animation preset 204 to apply to whichever object data 128 is associated with the 3D scene box 136. More specifically, in the illustrated example, a user has selected a selected animation preset 204 that causes an object within the 3D scene box 136 to travel from the first position within the 3D scene box 136 to a second position within the 3D scene box 136. Here, the user can select the file selection button 208 to quickly swap out which model is associated with the 3D scene box 136 so that different objects will be rendered as traveling from the first position to the second position.

As further shown, the animation preset GUI 200 includes a trigger criteria selection button 212 to enable a user to select the trigger criteria 126. For example, the user may define first trigger criteria 126 for triggering the box object illustrated in FIG. 2 to fly through the 2D text box 138 and off the page.

Figure 3A:
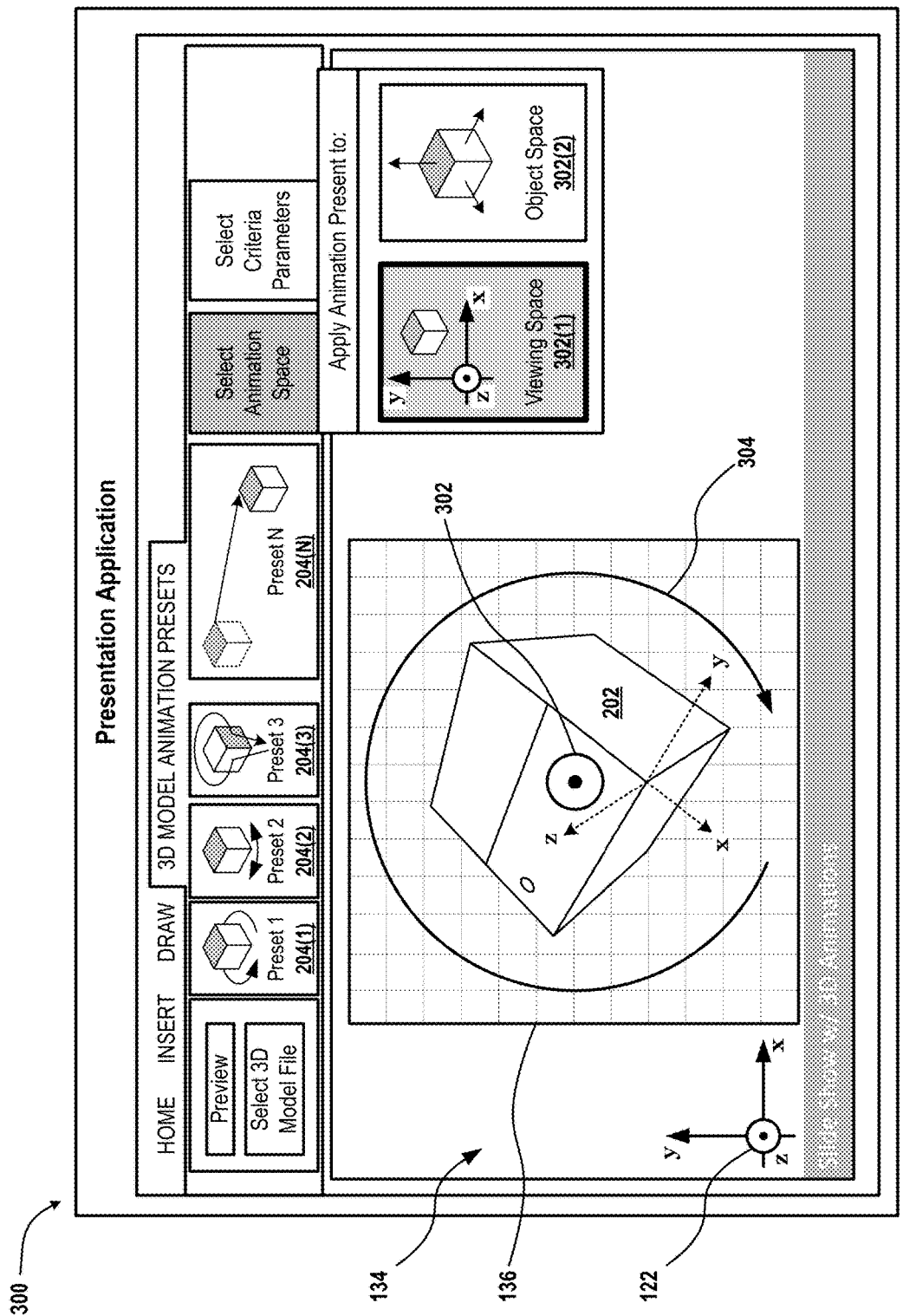
FIGS. 3A and 3B illustrate an exemplary animation preset GUI that includes multiple animation space selection buttons to cause a selected animation preset to be rendered against different coordinate systems.
Figure 3B:
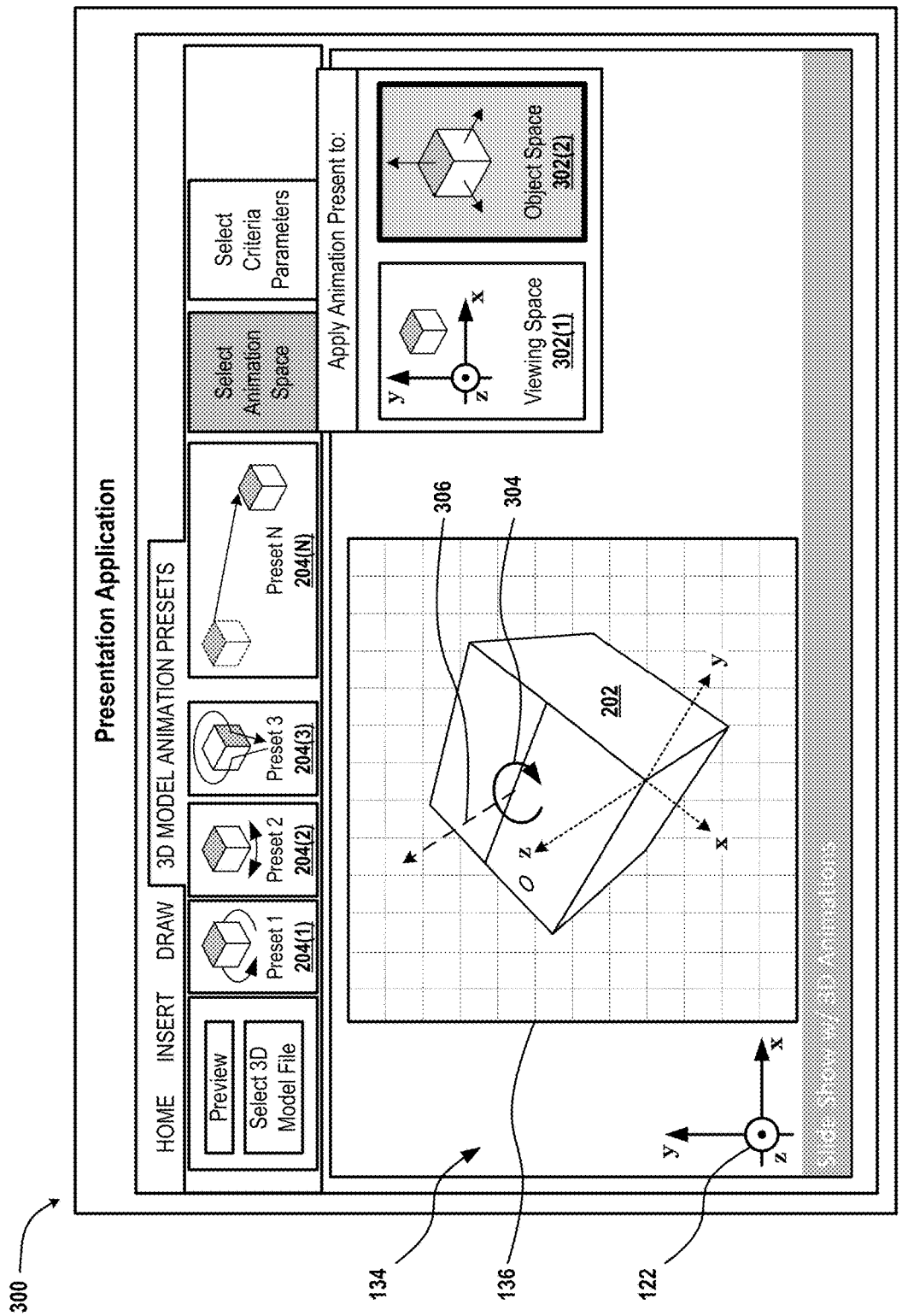

Turning now to FIGS. 3A and 3B (collectively referred to herein as FIG. 3), illustrated is an exemplary animation preset GUI 300 that enables a user to dynamically toggle between predefined animation spaces for animating the object 202. In the illustrated example, the animation preset GUI 300 includes a first animation space selection button 302(1) that causes a selected animation preset to be rendered against a "Viewing Space" that corresponds to the global coordinate system 122 (e.g., as defined by the application 104 and/or document data 130). As further illustrated, the animation preset GUI 300 includes a second animation space selection button 302(2) that causes a selected animation preset to be rendered against an "Object Space" that corresponds to the local coordinate system 130 (e.g., as defined by the object data 128).

Referring specifically to FIG. 3A, the exemplary animation preset GUI 300 is shown with the first animation space selection button 302(1) activated to cause a selected animation preset to be rendered against a "Viewing Space" that corresponds to the global coordinate system 122. For purposes of FIG. 3, consider that the selected animation preset is designed to cause the object 202 to rotate about an axis that is defined as being orthogonal (e.g., perpendicular) with a selected geometrical plane and as passing through a centroid of the object 202. Further suppose that the selected geometrical plane is a Z-plane of whichever animation space is currently selected. Under these circumstances, setting the animation space to the "Viewing Space" that corresponds to the global coordinate system 122 results in the object rotating about the axis 302 that is orthogonal to the "global" Z-plane of the global coordinate system 122 and that passes through the centroid of the object 202. Furthermore, in the illustrated example the object 202 is shown to rotate clockwise about the axis 302 as indicated by the directional arrow 304.

Turning now to FIG. 3B, the exemplary animation preset GUI 300 is shown with the second animation space selection button 302(2) activated to cause a selected animation preset to be rendered against an "Object Space" that corresponds to the local coordinate system 130. Considering that the selected animation preset has not been altered from FIG. 3A (i.e., only the animation space has been changed), the object 202 will still rotate about an axis that passes through its centroid. However, because the animation space has been toggled to cause the selected animation preset to be rendered against the "Object Space" that corresponds to the local coordinate system 130, the object 202 has begun to rotate clockwise about the axis 306 and the directional arrow 304.

Figure 4A:
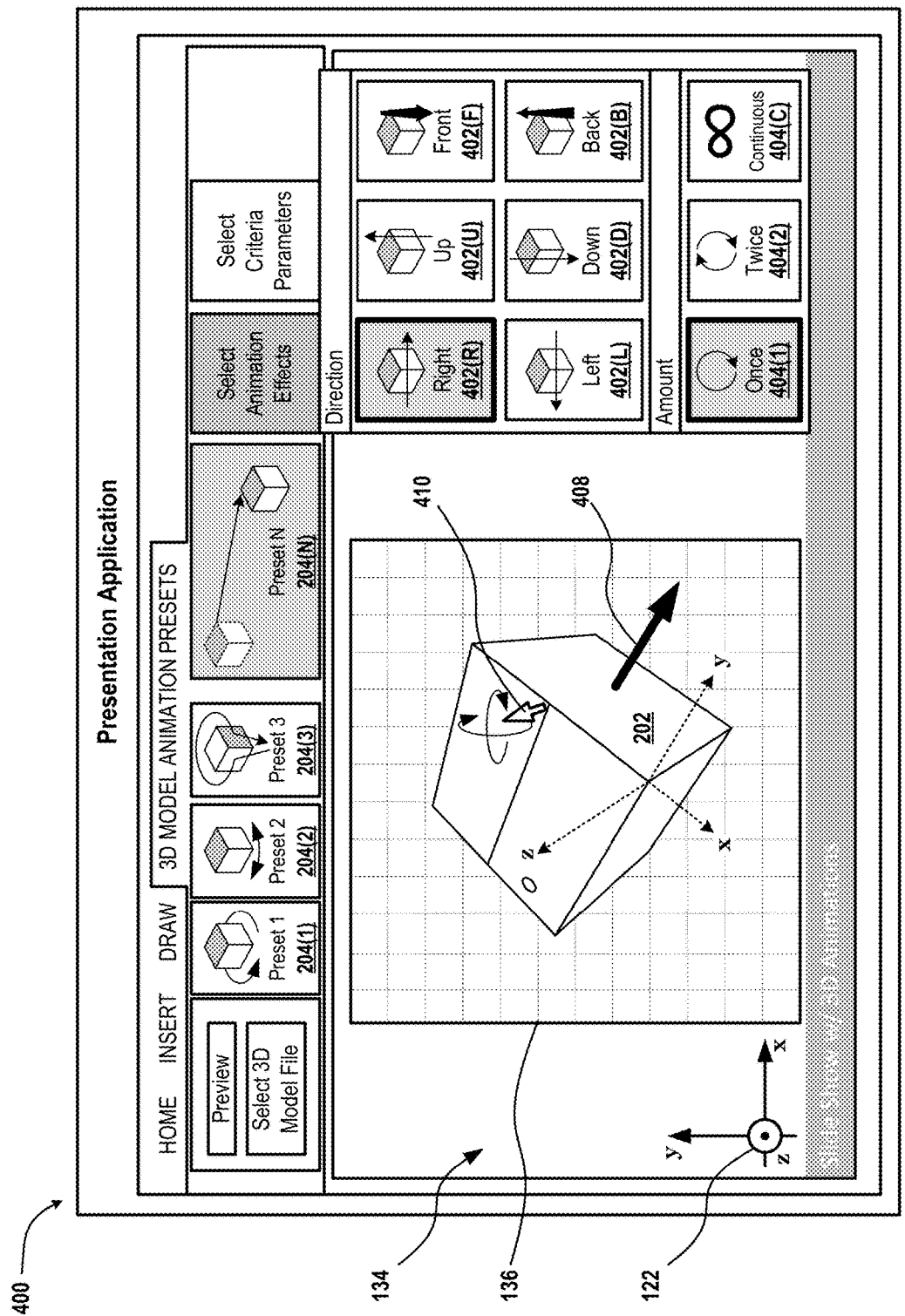
FIG. 4A illustrates an exemplary animation preset GUI that includes multiple translation direction selection buttons that enable the user to set a direction for a translation animation feature.

Turning now to FIG. 4A, illustrated is an exemplary animation preset GUI 400 that enables a user to select parameters for a selected animation preset. In the illustrated example, the animation preset GUI 400 includes multiple translation direction selection buttons 402 that enable the user to select a direction to translate the object 202. More specifically, the animation preset GUI 400 includes a translate "right" button 402(R) that causes the object to translate in a positive direction along a Y-axis, a translate "left" button 402(L) that causes the object to translate in a negative direction along a Y-axis, a translate "up" button 402(U) that causes the object to translate in a positive direction along a Z-axis, and so on. As illustrated, the user has selected the translate "right" button 402(R) to cause the object 202 to translate in the direction of the arrow 408. As further illustrated, the animation preset GUI 400 includes multiple animation amount selection buttons 404 that enable the user to select an amount of times that a selected animation preset occurs when triggered. More specifically, the animation preset GUI 400 includes an animate "once" button 404(1) that causes the animation to occur a single time, an animate "twice" button 404(2) that causes the animation to occur two times, and an animate "continuously" button 404(C) that causes the animation to continuously occur until stopped by a trigger event (e.g., switching to a next slide, a user manually stopping the animation, etc.).

In some implementations, the exemplary animation preset GUI 400 enables a user to dynamically modify an orientation of the object 202 (e.g., within a selected animation space) without modifying selected parameters for the selected animation preset. For example, as illustrated in FIG. 4A, the user has placed a mouse curser 410 over the object 202 to "grab" and reorient the object 202. In this example, regardless of how the user reorients the object the selected animation preset will still cause the object 202 to translate in the positive direction along the selected Y-axis; however, the orientation of the selected Y-axis (i.e., the local Y-axis) will change with respect to the global coordinate system 122. Accordingly, the user can orient the object as shown to cause the selected animation preset to animate the object in the direction indicated by the arrow 408 (e.g., slightly toward the user, downward on the viewing space, and to the right on the viewing space). Then, the user can reorient the object to cause the selected animation preset to animate the object in a different direction with respect to the viewing space. In this way, the user can easily modify and experiment with how a particular 3D animation interacts with other objects within a workspace such as, for example, the 2D work page 134.

Figure 4B:
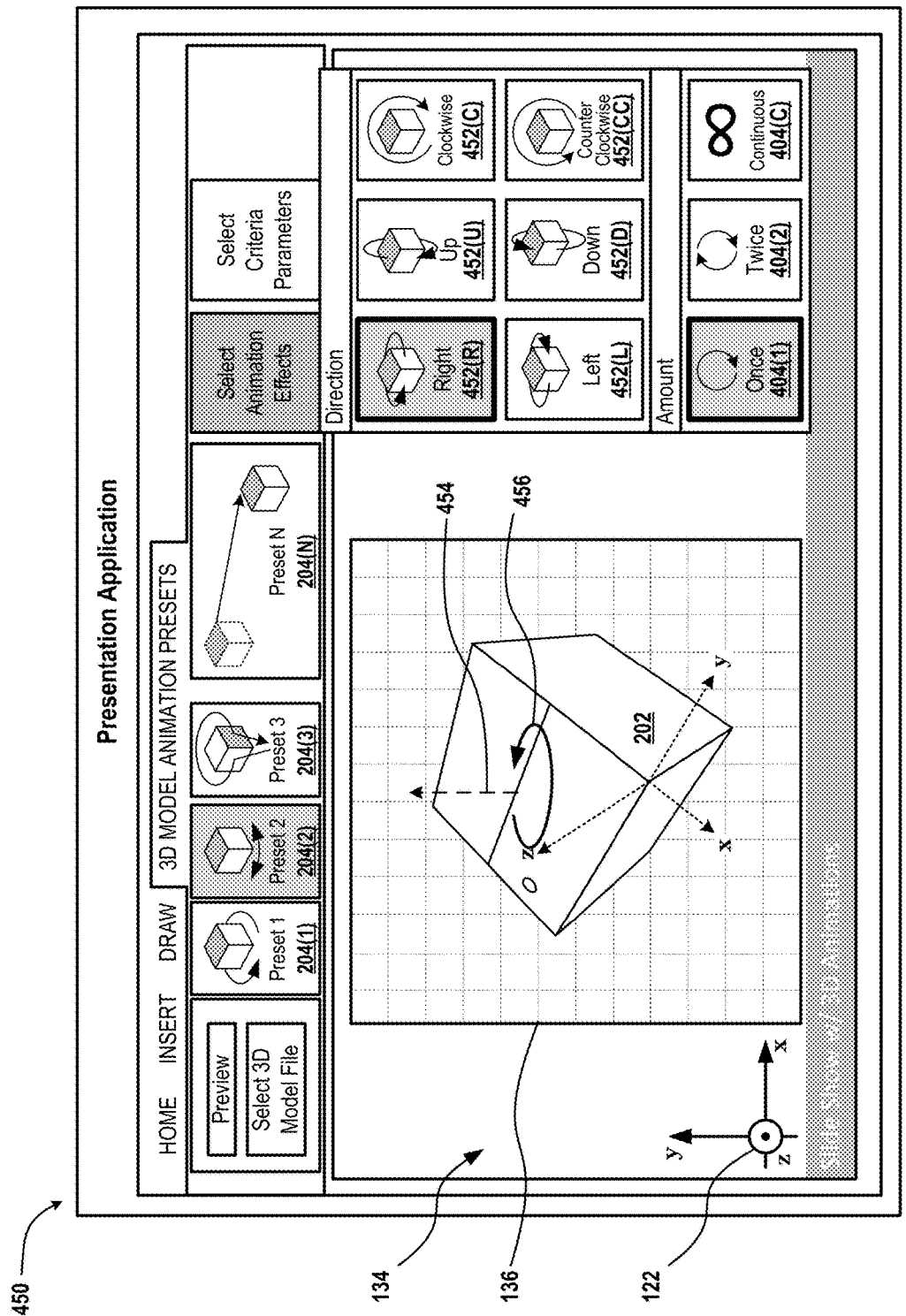
FIG. 4B illustrates an exemplary animation preset GUI that includes multiple rotational direction selection buttons that enable the user to set a direction for a rotation animation feature.

Turning now to FIG. 4B, illustrated is an exemplary animation preset GUI 450 that enables a user to select parameters for a selected animation preset. In the illustrated example, the animation preset GUI 450 includes multiple rotational direction selection buttons 452 that enable the user to select an axis and a direction to rotate the object 202 about the selected axis. More specifically, the animation preset GUI 450 includes a rotate "right" button 452(R) that causes the object to rotate about a Y-axis in a first direction and a counterpart rotate "left" button 452(L) that causes the object to rotate in the opposite direction about the Y-axis. The animation preset GUI 450 further includes a rotate "up" button 452(U) that causes the object to rotate about an X-axis in a first direction and a counterpart rotate "down" button 452(D) that causes the object to rotate in the opposite direction about the X-axis. The animation preset GUI 450 further includes a rotate "clockwise" button 452(C) that causes the object to rotate about a Z-axis in a first direction and a counterpart rotate "counter-clockwise" button 452 (CC) that causes the object to rotate in the opposite direction about the Z-axis. In the illustrated example, a user has selected the rotate "right" button 452(R) to cause the object to rotate about an axis 454 that passes through the centroid of the object 202 and is orthogonal to the global Y-axis (e.g., due to the user having set the current animation space to the "Viewing Space") in the direction indicated by the arrow 456.

FIGS. 5 through 9C illustrate various frame sequences for exemplary animation presets that include combinations of animation features. The individual frames of a frame sequence for any individual animation preset are overlaid over a reference grid to visually communicate how the individual animation preset renders motion of the object. The individual reference grids are each shown with respect to the global coordinate system 122 shown in the lower left-hand corner of each reference grid. As an example of how the object's illustrated position with respect to the reference grid may communicate motion, if between a first frame and a second frame every point of the object moves upward with respect to the reference grid, then the first frame and second frame are designed to visually communicate that the object has translated positively along the global Y-axis. As another example, if between a first frame and a second frame the size at which the object is rendered with respect to the reference grid increases, then the first frame and second frame are designed to visually communicate that the object has translated positively along the global z-axis.

Figure 5:
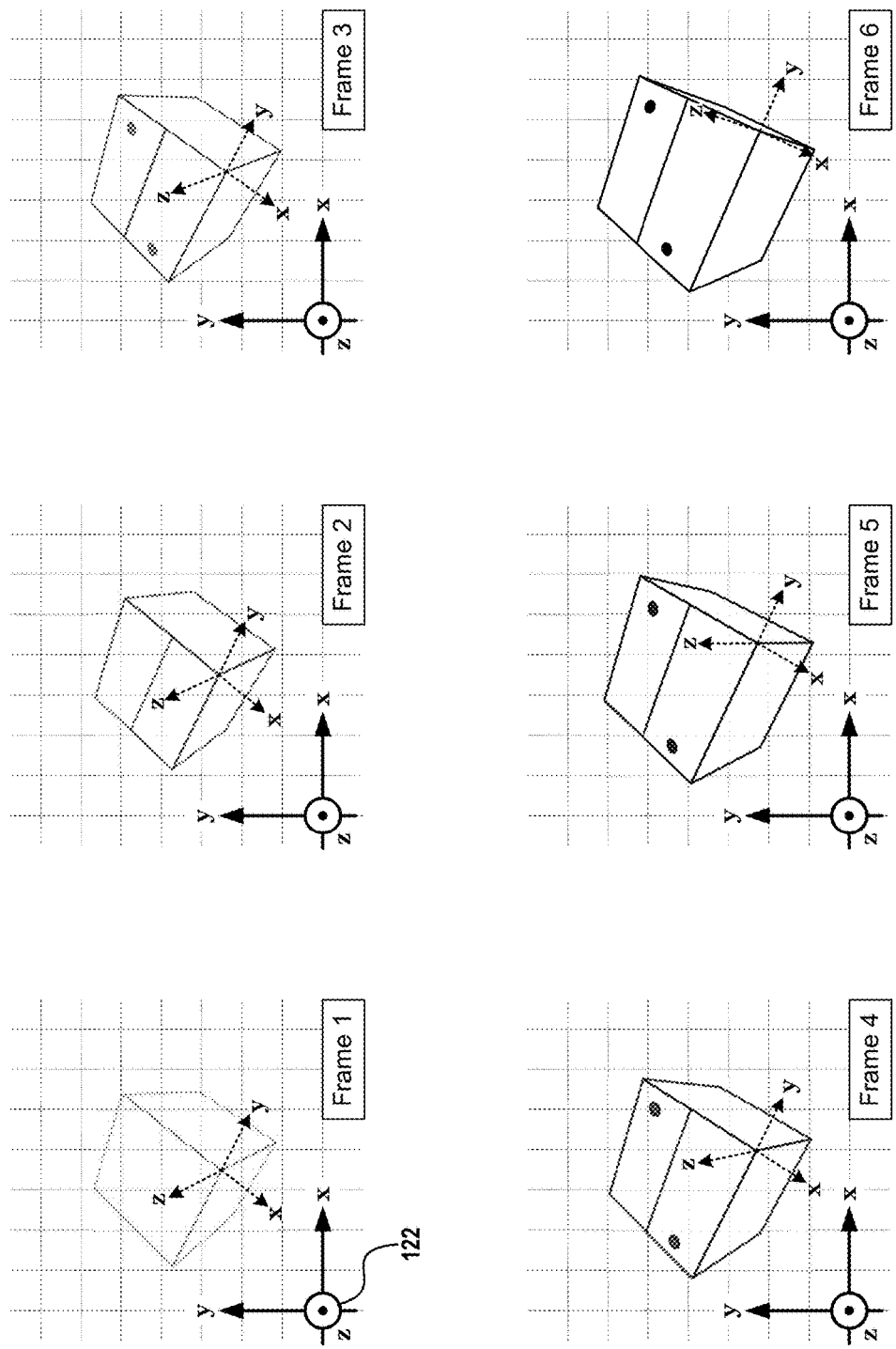
FIG. 5 illustrates a frame sequence for an exemplary animation preset that is designed to animate an object as entering and/or exiting a workspace.

Turning now to FIG. 5, illustrated is a frame sequence for an exemplary animation preset that is designed to animate an object as entering a workspace. The frame sequence includes six ("6") individual frames that can be sequentially rendered to communicate to a viewer that the object has entered the workspace. The exemplary animation preset of FIG. 5 corresponds to a combination of an opacity animation feature, a translation animation feature, and a rotation animation feature.

In the illustrated example, the opacity animation feature causes the opacity of the rendered object to increase incrementally from the first frame to the sixth frame. In the specifically illustrated but nonlimiting example, at the first frame the object may be rendered at an opacity level of twenty percent ("20%") and then increase to an opacity level of fifty percent ("50%") at the second frame, an opacity level of seventy percent ("70%") at the third frame, an opacity level of ninety percent ("90%") at the fourth frame, an opacity level of ninety-five percent ("95%") at the fifth frame, and ultimately an opacity level of one-hundred percent ("100%") at the sixth frame.

In the illustrated example, the translation animation feature causes the position of the rendered object to translate toward the viewer (e.g., out of the page) along the z-axis of the "Viewing Space" defined by the global coordinate system 122 (shown in each frame but labeled in Frame 1 only). Therefore, the translation animation feature causes the size at which the object is rendered to increase incrementally from the first frame to the sixth frame to impress upon viewers that the object is becoming closer to them.

Furthermore, in the illustrated example, the rotation animation feature causes the orientation of the rendered object to rotate along an axis that is orthogonal to the global Y-axis and that passes through the object's centroid. Accordingly, it can be seen from the frame sequence of FIG. 5, that discrete surfaces of the object become more or less prominent as the orientation of the object rotates from the first frame to the sixth frame. For example, the lower right surface of the object is relatively more prominent in the first frame than in the sixth frame where it is almost completely obscured by the top surface and lower left surface of the object. The changes in the orientation of the object between each frame can further be appreciated from the changes in the orientation of the local coordinate system 130 that remains fixed with respect to the object in terms of both location and orientation.

In some implementations, an exemplary animation preset may be designed to animate the object exiting the workspace. Such an exemplary animation preset may substantially correspond to the frame sequence of FIG. 5 with the exception that the order in which the frames are rendered may be reversed. Stated more plainly, an exemplary "entrance" animation preset may correspond to the six frames of FIG. 5 being sequentially rendered starting from the first frame and ending on the sixth frame, whereas in contrast an exemplary "exit" animation preset may correspond to the same six frames of FIG. 5 being sequentially rendered starting from the sixth frame and ending on the first frame.

Figure 6:
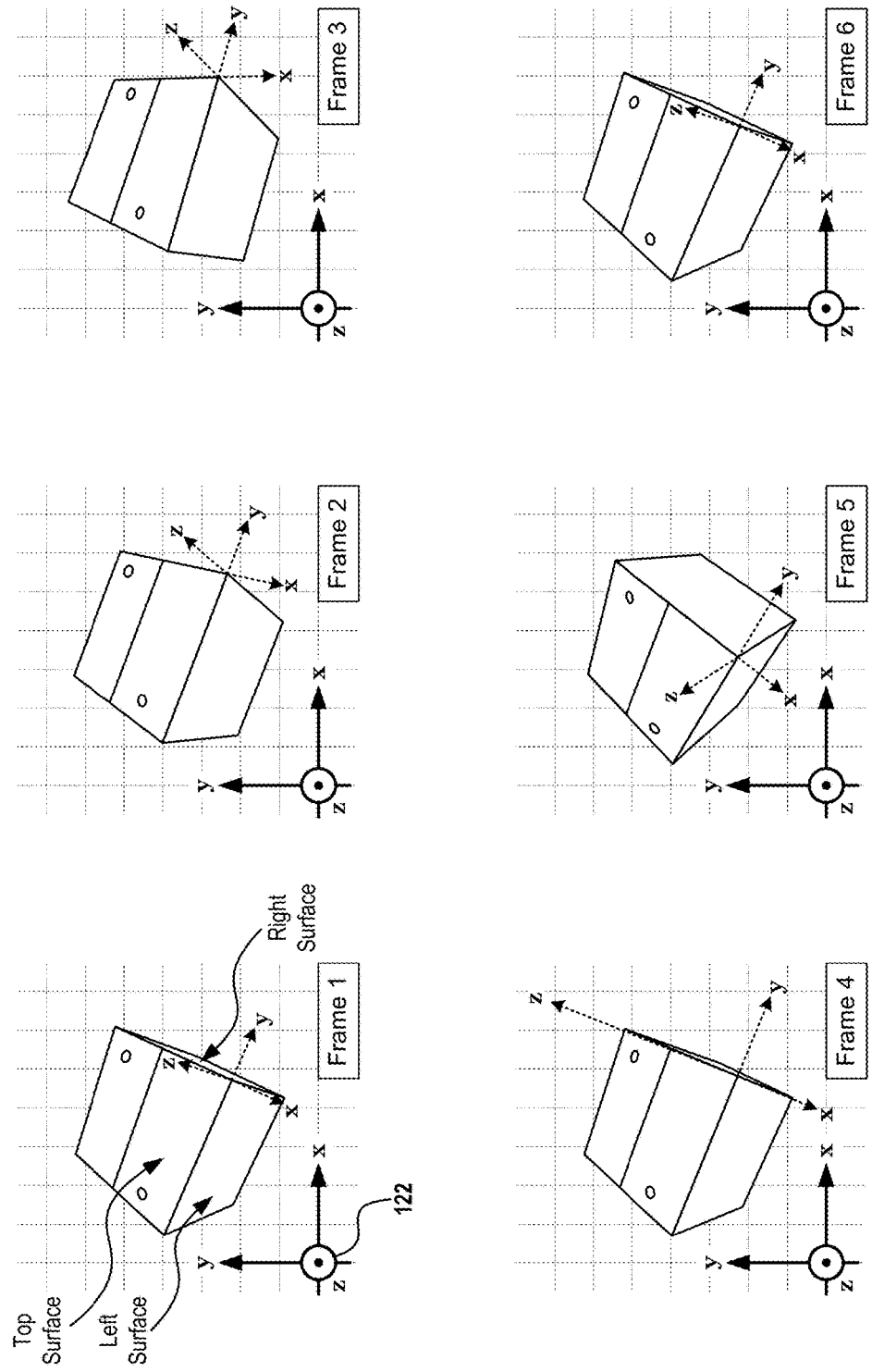
FIG. 6 illustrates a frame sequence for an exemplary animation preset that is designed to animate an object as swinging from right to left in a predetermined manner about a selected axis.

Turning now to FIG. 6, illustrated is a frame sequence for an exemplary animation preset that is designed to animate an object as swinging from right to left in a predetermined manner. More specifically, the exemplary animation preset of FIG. 6 causes the object to rotate first counterclockwise around the global Y-axis and then to toggle between rotating clockwise and counterclockwise around the global Y-axis. The exemplary animation preset of FIG. 6 corresponds to a combination of at least a rotational-acceleration animation feature and a rotational-deceleration animation feature. For explanatory purposes, three discrete surfaces of the object are labeled in the first frame of FIG. 6. More specifically, a top surface is labeled, a left surface is labeled, and a right surface is labeled. The remaining surfaces of the object do not become visible in any of the first frame through the sixth frame of FIG. 6 and therefore are not labeled.

At the first frame, the object is shown in a first ("starting") orientation at which each of the top surface, left surface, and right surface are at least partially visible. Starting from the first frame, the exemplary "swing" animation preset causes the object to accelerate counterclockwise about the global Y-axis until the second orientation at which only the left surface and top surface remain visible. Starting from the second frame, the exemplary "swing" animation preset causes the object to beginning decelerating until reaching an angular velocity of zero at the third orientation shown in the third frame. Then, starting from the third frame, the exemplary "swing" animation preset causes the object to begin accelerating clockwise about the global Y-axis until the fourth orientation at which the right surface has become again visible (albeit slightly). Starting from the fourth frame, the exemplary "swing" animation preset causes the object to beginning decelerating until reaching an angular velocity of zero at the fifth orientation shown in the fifth frame. Then, starting from the fifth frame, the exemplary "swing" animation preset causes the object to rotate back to the "starting" orientation (i.e., the first orientation and the sixth orientation are identical) at which the animation preset ends.

In some implementations, an exemplary animation preset may be designed to animate the object fully rotating one or more times about a selected axis. For example, an exemplary "rotate" animation preset may be similar to the illustrated "swing" animation preset with the exception that once the object has accelerated to a predetermined angular velocity about the selected axis, the object continues to rotate in the same direction (e.g., rather than toggling between clockwise and counterclockwise rotation) continuously and/or until reaching a predetermined orientation at which the object begins to decelerate until reaching an angular velocity of zero at the "starting" orientation.

Figure 7:
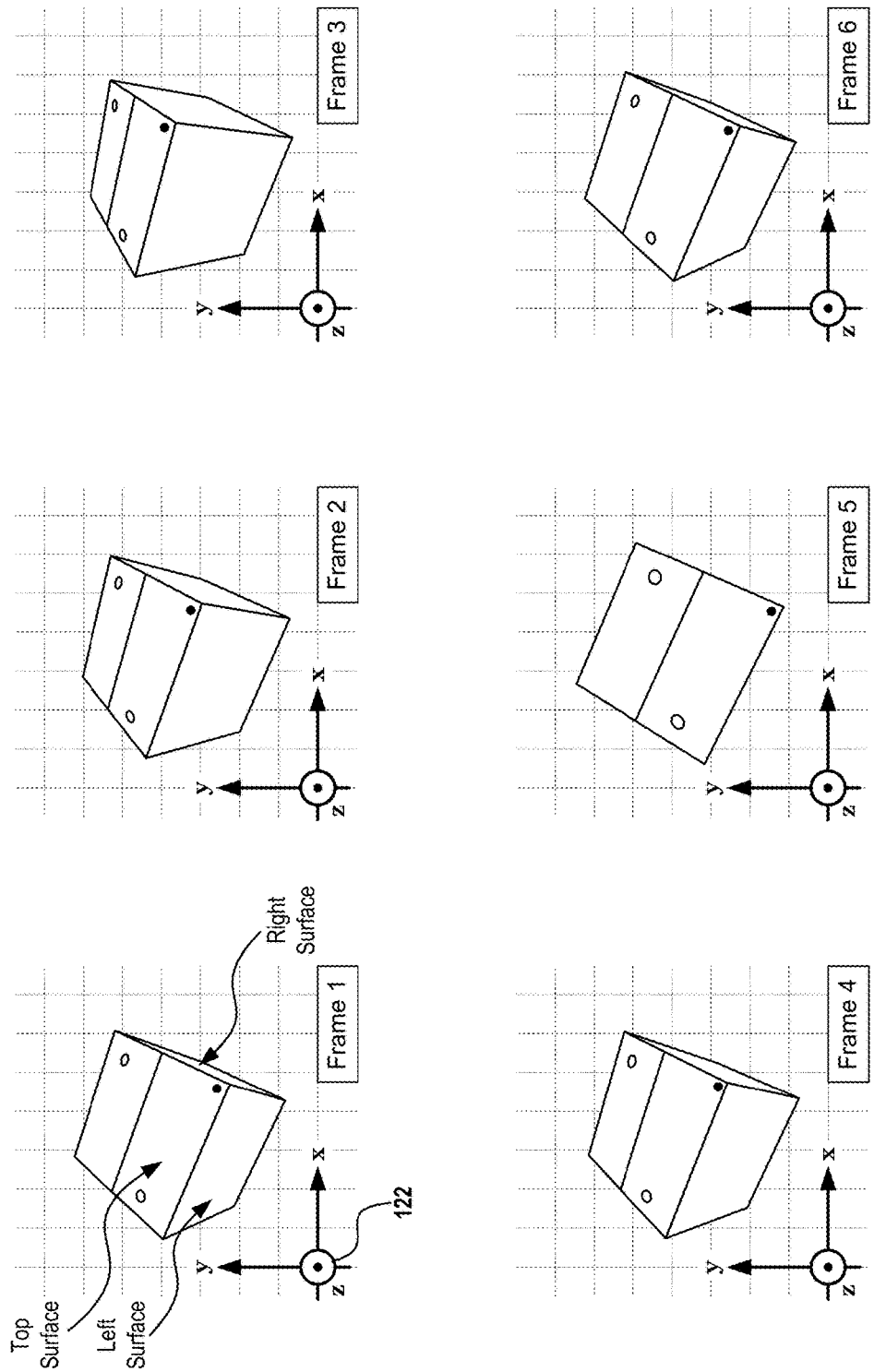
FIG. 7 illustrates a frame sequence for an exemplary animation preset that is designed to animate an object as swinging up and down in a predetermined manner about a selected axis.

Turning now to FIG. 7, illustrated is a frame sequence for an exemplary animation preset that is designed to animate an object as swinging up and down in a predetermined manner. More specifically, the exemplary animation preset of FIG. 7 causes the object to rotate first counterclockwise around the global X-axis and then to toggle between rotating clockwise and counterclockwise around the global X-axis. The exemplary animation preset of FIG. 7 is similar to the exemplary animation preset of FIG. 6 with the exception that the user has selected a different axis for the exemplary animation to be rendered against. The first ("starting") frame of FIG. 7 is identical to the first ("starting") frame of FIG. 6 and the same three discrete surfaces are labeled.

At the first frame, the object is shown in the first ("starting") orientation at which each of the top surface, left surface, and right surface are at least partially visible. Starting from the first frame, the exemplary "swing" animation preset causes the object to accelerate counterclockwise about the global X-axis until the second orientation at which only the left surface and the right surface have become more prominent while the top surface has become less prominent. Starting from the second frame, the exemplary "swing" animation preset causes the object to begin decelerating until reaching an angular velocity of zero at the third orientation shown in the third frame. Then, starting from the third frame, the exemplary "swing" animation preset causes the object to begin accelerating clockwise about the global X-axis until the fourth orientation which is substantially similar to the first orientation. Starting from the fourth frame, the exemplary "swing" animation preset causes the object to beginning decelerating until reaching an angular velocity of zero at the fifth orientation shown in the fifth frame and at which each of the left surface and the right surface have become obscured by the top surface. Then, starting from the fifth frame, the exemplary "swing" animation preset causes the object to rotate back to the "starting" orientation (i.e., the first orientation and the sixth orientation are identical) at which the animation preset ends.

In various implementations, a user may dynamically modify one or more parameters for a selected animation preset by toggling through the plurality of translational direction selection buttons 402 and/or rotational direction selection buttons 452. For example, referring specifically to the differences between FIG. 6 and FIG. 7, in various implementations a user may dynamically modify the animation of the object from that shown in FIG. 6 to that shown in FIG. 7 by deselecting the rotate "right" button 452(R) that causes the object to rotate about a Y-axis in a first direction and selecting the rotate "up" button 452(U) that causes the object to rotate about an X-axis in a first direction.

Figure 8B:
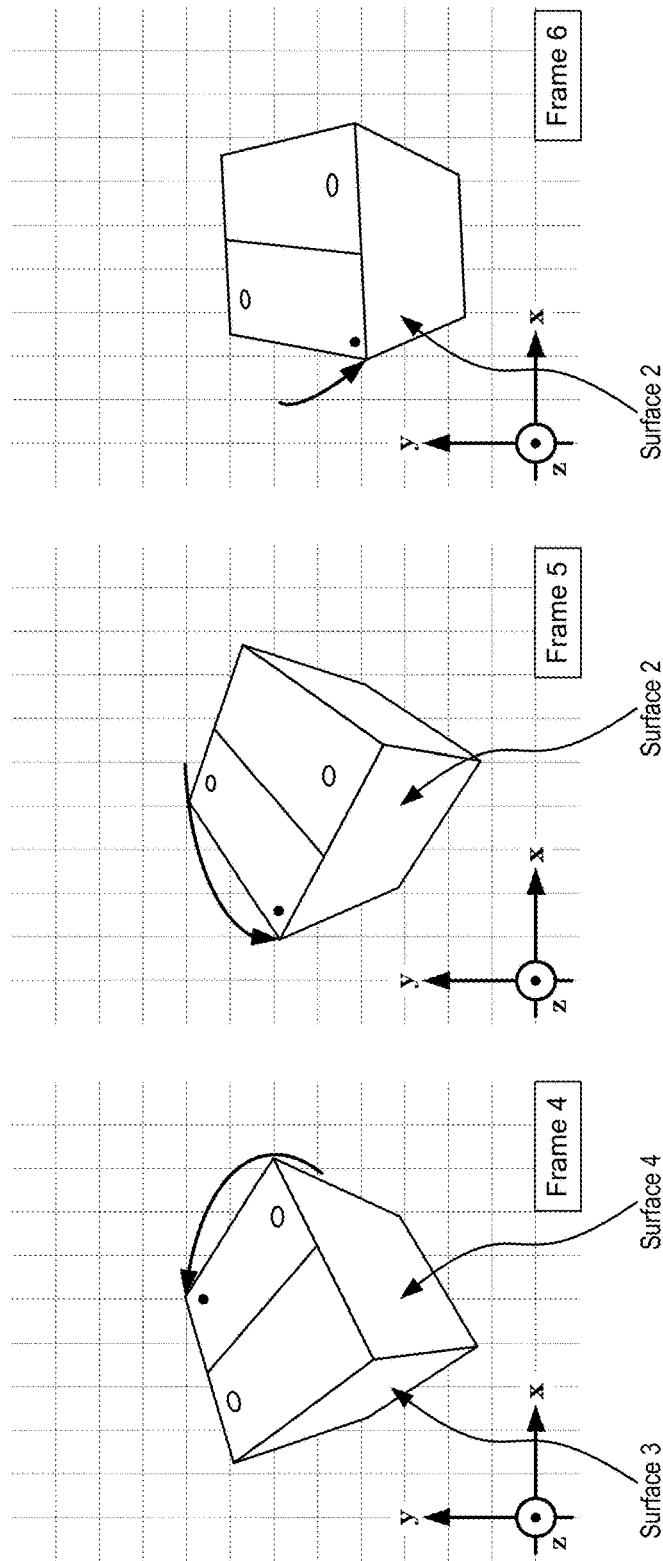
Figure 8C:
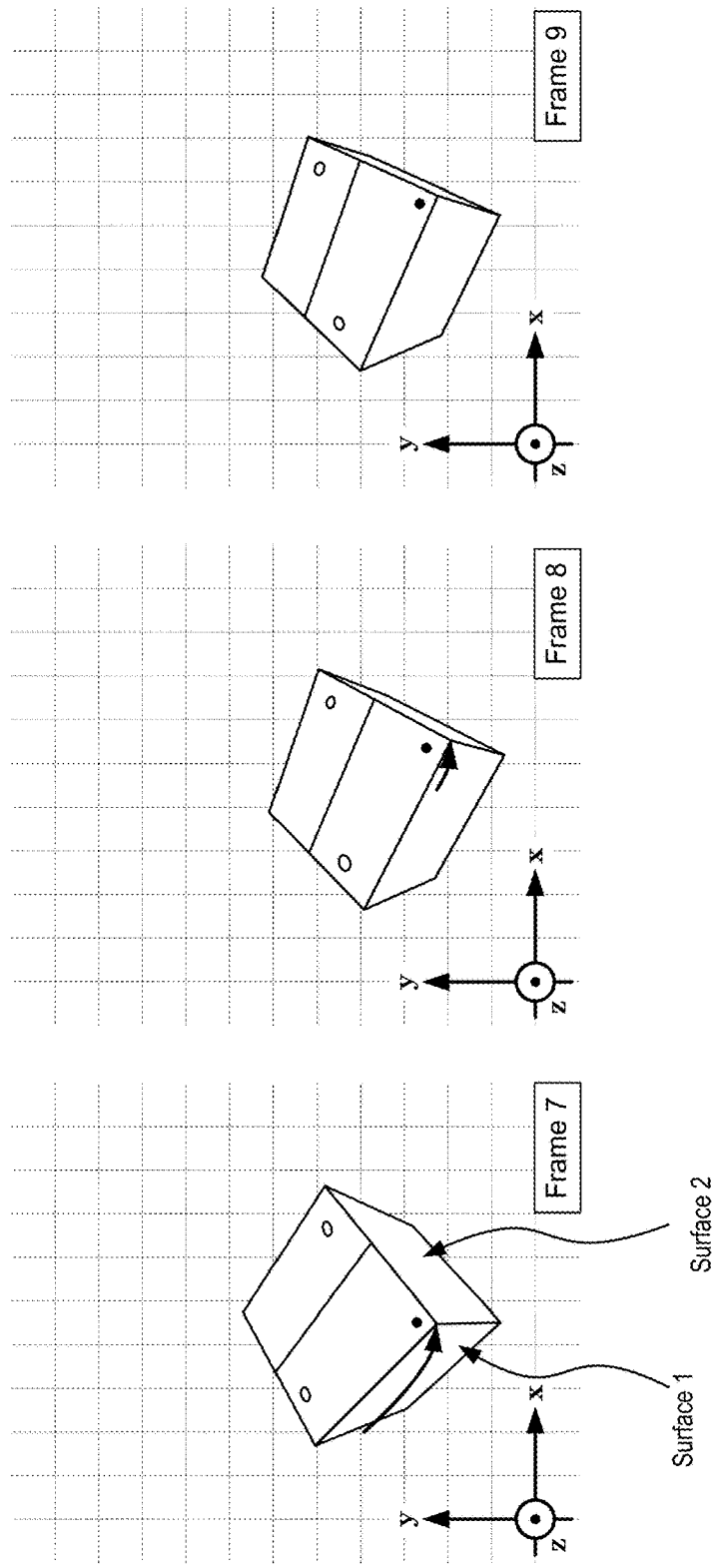

Turning now to FIGS. 8A through 8C (collectively referred to as FIG. 8), illustrated is a frame sequence for an exemplary animation preset that is designed to animate an object as "jumping" and "spinning." The frame sequence includes nine ("9") individual frames that can be sequentially rendered to attract the attention of a viewer to the object. The exemplary animation preset of FIG. 8 corresponds to a combination of at least a deformation animation feature, a translation animation feature, and a rotation animation feature. In various instances, the exemplary animation preset of FIG. 8 further corresponds to an acceleration animation feature to cause the rendering to smoothly transition into and/or out of various motions.

At the first frame, the object is shown in a first ("starting") orientation at which each of a first surface (labeled "Surface 1") and a second surface (labeled "Surface 2") are visible. Starting from the first frame, the exemplary "jump and turn" animation preset causes the object to become compressed along a specific axis into a deformed state (e.g., in which the exterior shape of the object has been deformed) as shown at the second frame. For example, with specific reference to the front top corner of the object (e.g., the corner that has been marked with a black dot), it can be seen with reference to the reference grid of FIG. 8 that this corner has moved slightly downward from the first frame to the second frame. In some implementations, the axis along which the object becomes compressed may correspond specifically to an axis of translation along which the object will subsequently begin to move (e.g., as shown in the third frame). For example, in some implementations the object may be compressed along an axis of translation into a deformed state and then subsequently decompressed on this axis back into a non-deformed state just prior to beginning to translate along the axis of translation. It can be appreciated that such a combination of animation features may impress upon viewers that the object has squatted down in preparation to jump up along the axis of translation.

Accordingly, starting from the second frame, the deformation animation feature returns the object to its non-deformed state (e.g., its default state in accordance with the object data 128). Also starting from the second frame, a translation animation feature begins to translate the object in a positive direction along a particular axis (e.g., a Y-axis of the local coordinate system 130) while a rotation animation feature begins to rotate the object about the particular axis. For example, by comparing the object's orientation in position to the reference grid (which remains unchanged from frame to frame) it can be appreciated that the object has moved upward and has also rotated such that the second surface is no longer visible and a fourth surface (labeled "Surface 4") has become visible. From the third frame to the fourth frame, the object has translated farther upward and has also rotated more about the particular axis. From the fourth frame to the fifth frame, a translational deceleration animation feature has slowed the object to a translational velocity of zero at an apex of the "jump and turn" animation feature. Additionally, from the fourth frame to the fifth frame, the object continues to rotate about the particular axis. For example, at the fifth frame the second surface has again become visible. From the fifth frame to the sixth frame, the translation animation feature begins to translate the object in a negative direction along a particular axis (e.g., back towards its starting position).

From the sixth frame to the seventh frame, the object has almost returned to its starting position with the exception that it is oriented slightly differently. For example, the second surface is more prominent in in the seventh frame than in the first frame. Then, starting from the seventh frame, the deformation animation feature deforms the object in a similar manner to that previously described. Finally, between the eighth frame in the ninth frame, the object returns to its starting position and the "jump and turn" animation preset has been completed.

Figure 9C:
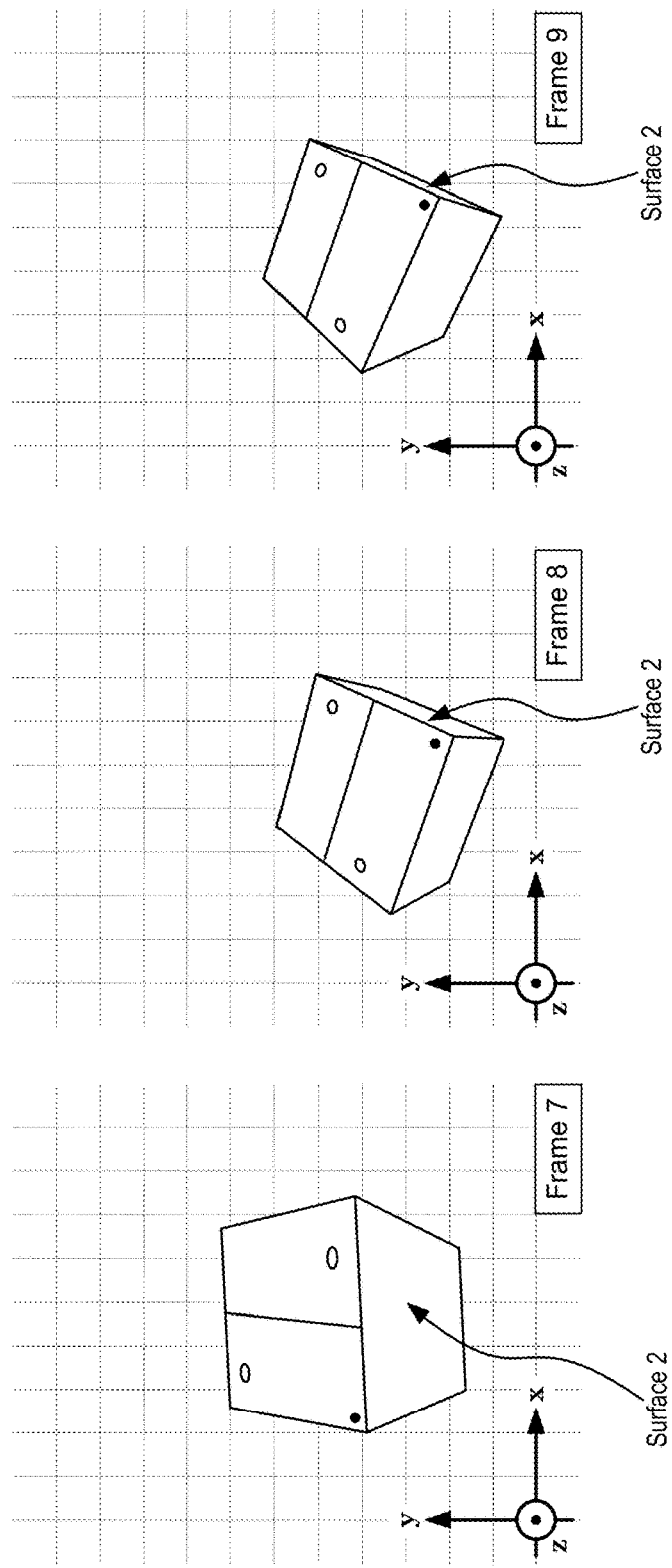

Turning now to FIGS. 9A through 9C (collectively referred to as FIG. 9), illustrated is a frame sequence for the exemplary animation preset of FIG. 8 with the exception that an intensity level preset has been modified to increase magnitude and/or acceleration parameters with which the exemplary animation preset is rendered against the object. For example, the same object of FIG. 8 is shown to jump higher and spin faster in FIG. 9 as compared to FIG. 8 due to the intensity level preset being increased in FIG. 9 as compared to FIG. 8. As a more specific but nonlimiting example (and with reference to FIG. 2), FIG. 8 may correspond specifically to the user having selected the third animation preset button 204(3) in conjunction with a "subtle" intensity level preset 206(1) whereas FIG. 9 may correspond specifically to the user have toggled the intensity level from "subtle" to the "strong" intensity level preset 206(N).

Figures 10A, 10B, 10C:
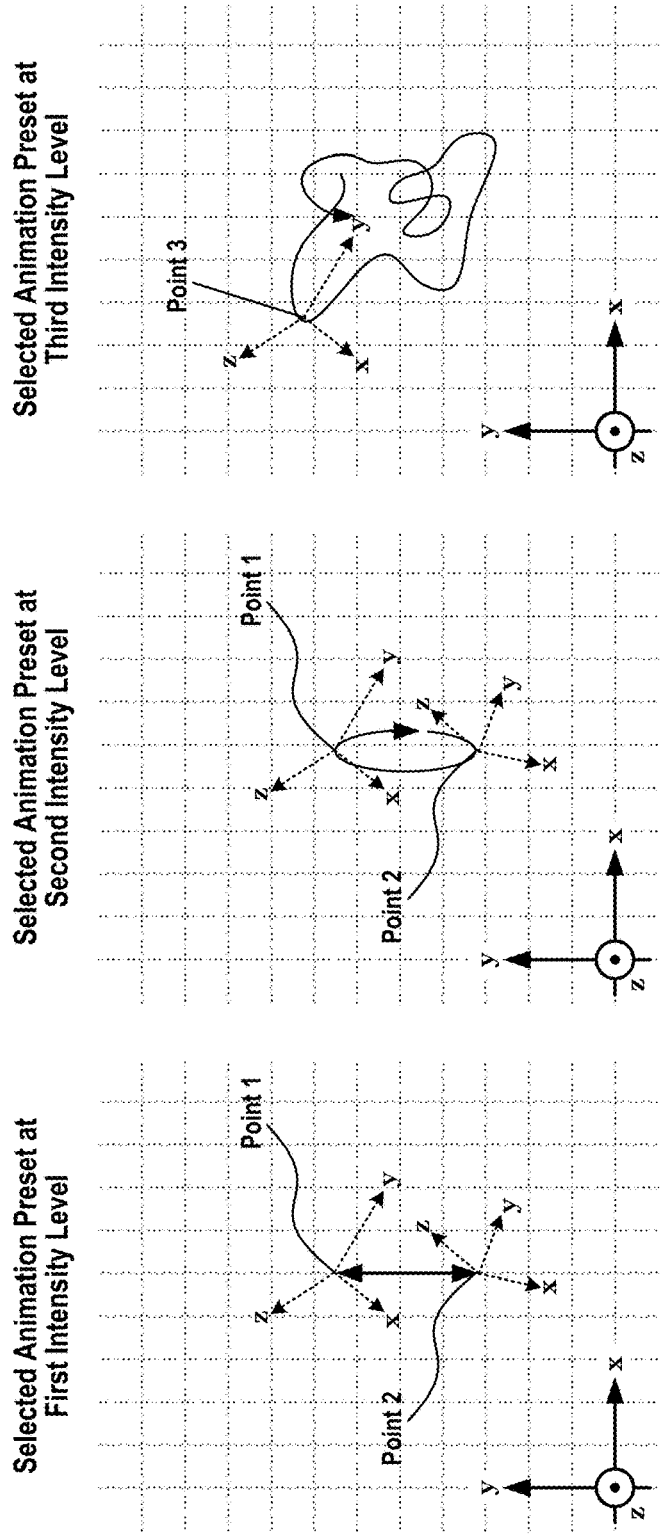
FIGS. 10A through 10C (collectively referred to as FIG. 10) illustrate various movement patterns for an exemplary animation preset that is designed to animate an object as "hovering" in a working space. Each of FIGS. 10A through 10C illustrate the same "hover" animation preset at a different intensity level preset.

Turning now to FIGS. 10A through 10C (collectively referred to as FIG. 10), illustrated are various movement patterns for an exemplary animation preset that is designed to animate an object as "hovering" in a working space. Each of FIGS. 10A through 10C illustrate the "hover" animation feature at a different intensity level preset.

Turning now to FIG. 10A, a first movement pattern for the "hover" animation preset is shown that corresponds to a first intensity level. In this example, when set to the first intensity level the "hover" animation feature causes an object to oscillate (e.g., translate back and forth) along a single axis while an orientation of the object rotates about one or more axis to impress upon a viewer that the object is wobbling in space. For illustrative purposes, the local coordinate system 130 is shown both at a first point and a second point, and between the first and second point the orientation of the local coordinate system 130 has changed.

In some implementations, modifying an intensity level preset for a selected animation preset may result in the object translating along and/or rotating about more or less axis. For example, due to being set to the first intensity level preset, at FIG. 10A the object translates along a single axis. However, once the intensity level is increased to the second intensity level preset at FIG. 10B, the object begins to translate along to more axes in a predetermined pattern. At both of FIGS. 10A and 10B, the object translates according to a standard and predictable pattern that repeatedly passes the first point and second point. At FIG. 10B the orientation of the object continues to dynamically change to render the wobbling effect.

In some implementations, modifying an intensity level for a selected animation preset may result in translation and/or rotation of the object becoming randomized. For example, due to being set to the first intensity level preset at FIG. 10A and the second intensity level preset at FIG. 10B, the object is shown to translate along one or more axes according to a standard and predictable pattern. However, once the intensity level is increased to the third intensity level preset at FIG. 10C, the translation animation feature and/or rotation animation feature departs from a standard and predictable pattern to give the impression that the object's position and/or orientation are randomly changing over time. For example, the translation animation feature and/or rotation orientation feature may be designed to render the object as if it were being affecting by random motions of a surrounding medium (e.g., similar to how a "hovering" helicopter may in a real environment move and wobble due to wind forces). Accordingly, rather than continuing to follow a standard and predictable pattern that repeatedly passes through the first point and second point, a randomized pattern is determined for the object to translate and/or rotate.

Figure 11:
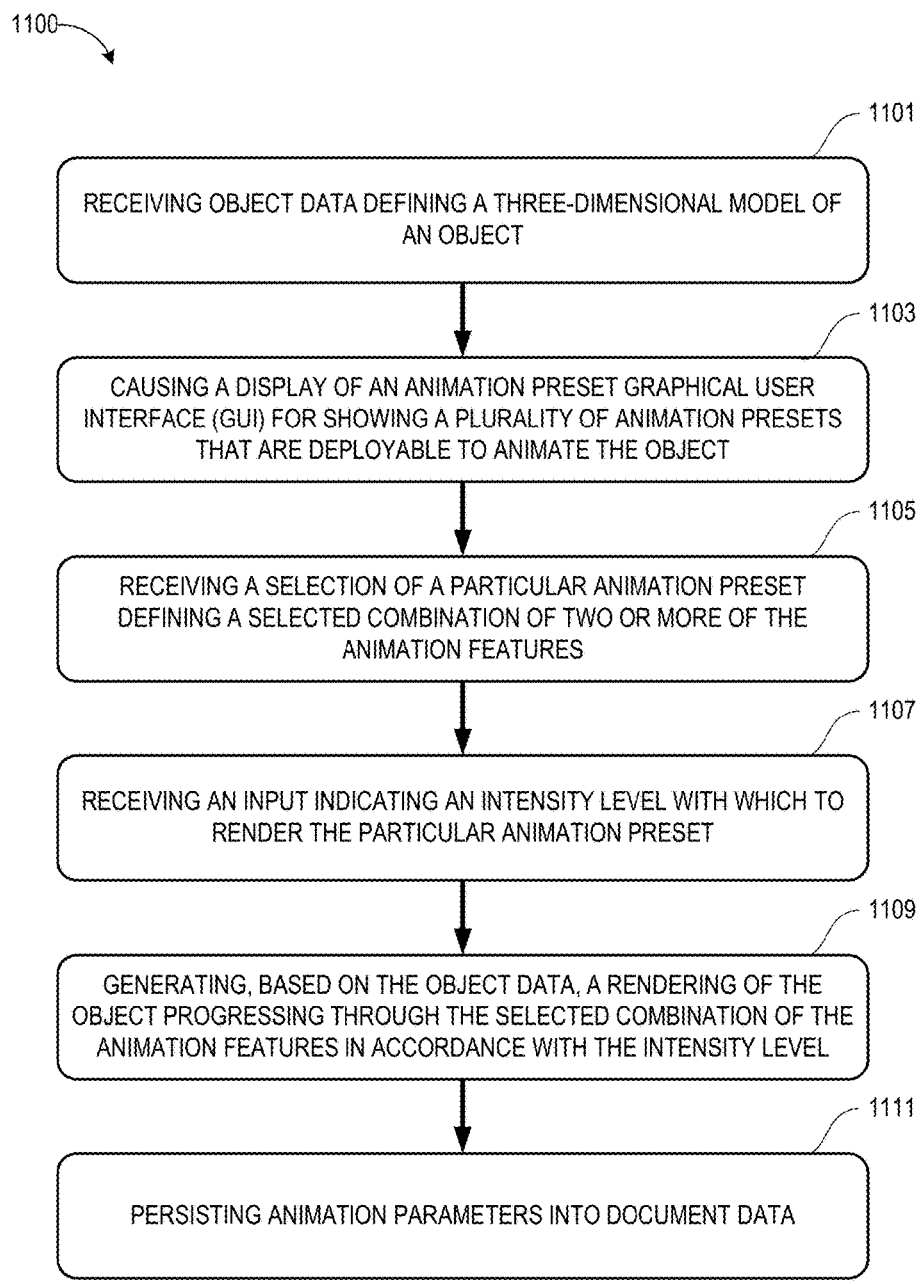
FIG. 11 is a flow diagram of an example method for enabling a user to animate an object by selecting between animation presets defining combinations of animation features and further selecting intensity level presets defining magnitude parameters and/or acceleration parameters for rendering the combinations of animation features.

FIG. 11 is a flow diagram of an example method 1100 for enabling a user to quickly and seamlessly animate a 3D model of an object by selecting between animation presets, which define combinations of animation features, and intensity levels, which define magnitude and/or acceleration parameters, for rendering the combinations of animation features. The process 1100 is described with reference to FIGS. 1-10. The process 1100 is illustrated as a collection of blocks in a logical flow graph, which represent a sequence of operations that can be implemented in hardware, software, or a combination thereof. In the context of software, the blocks represent computer-executable instructions that, when executed by one or more processors, perform the recited operations. Generally, computer-executable instructions include routines, programs, objects, components, data structures, and the like that perform or implement particular functions. The order in which operations are described is not intended to be construed as a limitation, and any number of the described blocks can be combined in any order and/or in parallel to implement the process. Other processes described throughout this disclosure shall be interpreted accordingly.

At block 1101, an application 104 may receive object data 128 that defines a 3D model of an object. As described above, the object data 128 may be in any suitable format for communicating details of a 3D model of an object.

At block 1103, the application 104 may display an animation preset GUI to show multiple animation presets to the user that are deployable to animate the object. Individual animation presets define individual combinations of animation features as described herein. For example, exemplary animation presets are set forth in detail with respect to FIGS. 5 through 10. In various implementations, individual combinations of animation features that include one or more of: a translation animation feature that is deployable to cause a position of the object to translate with respect to a selected coordinate system; a rotation animation feature that is deployable to cause an orientation of the object to change with respect to the selected coordinate system; an opacity animation feature that is deployable to cause an opacity and/or transparency level of the object to change over time; a deformation animation feature that is deployable to cause a shape of the object to change over time; and/or an acceleration/deceleration animation feature that smoothes changes in the object's rotational and/or linear velocity over time.

At block 1105, the application 104 may receive a selection of a selected animation preset that defines a selected combination of two or more of the animation features. As a specific but nonlimiting example, the application 104 may receive a selection of the animation preset 204(N) to cause the object to be animated in accordance with the "jump and turn" animation preset as described herein with respect to FIGS. 8A through 9C.

At block 1107, the application 104 may receive an input indicating an intensity level with which to render the selected animation preset. For example, continuing with the example in which the user has selected the "jump and turn" animation preset, at block 1107 the user may select the first intensity level preset 206(1) as shown in FIG. 2 to cause the "jump and turn" animation preset to be rendered at the "subtle" intensity level preset. Alternatively, at block 1107 the user may select the N-th intensity level preset 206(N) to cause the "jump and turn" animation preset to be rendered at the "strong" intensity level preset.

At block 1109, the application 104 may generate, based on the object data, the rendering of the object progressing through the selected combination of animation features in accordance with the selected intensity level.

At block 1111, the application 104 may persist animation parameters associated with one or both of the particular animation preset or the selected intensity level preset into the document data 132. For example, under circumstances in which the document data 132 is a slide application file (e.g., a GOOGLE SLIDES file, a MICROSOFT POWERPOINT file, etc.), the application 104 may save, into the slide application file, animation parameters (e.g., which animation preset and/or intensity level preset is selected) what a user defines at any one of blocks 1101 through 1107. This enables the application 104 to subsequently re-load the document data 132 to again render the animation as described with respect to block 1109 without progressing through one or more of the operations described with relation to blocks 1101 through 1107.

In some embodiments, the application 104 may persist animation parameters into the document data 132 in terms of the underlying functional relationships that define a particular rendering (e.g., rather than in terms of an existing animation preset definition). For example, if an existing "swing" animation preset is designed to cause an object to swing back and forth along a total angular range of thirty ("30") degrees, the application 104 may store an indication that the object is to rotate thirty ("30") degrees rather than a bare reference to the existing "swing" animation preset. In this way, if the existing "swing" animation preset is modified (e.g., in a software update to the application 104 to cause the object to instead swing back and forth along a total angular range of sixty ("60") degrees), the animation parameters that are persisted into the document data 132 will continue to cause the object to swing back and forth along a total angular range of thirty ("30") degrees rather than changing the defined animation to match the updated "swing" animation preset.

In some embodiments, the application 104 may write the object data 128 directly into the document data 132 to enable future renderings of the object progressing through the selected combination of animation features and/or editing of the animation parameters (e.g., which animation preset and/or intensity level preset is selected) without the application 104 needing to externally reference the object data 128. In this way, since the object data 128 that defines the 3D model of the object has been integrated directly into the document data 132, users can share the document data 132 alone (e.g., without also providing an instance of the object data 128) with other users whom can then open the document data 132 to view the rendering of the object or even modify animation parameters to change the animation.

Figure 12:
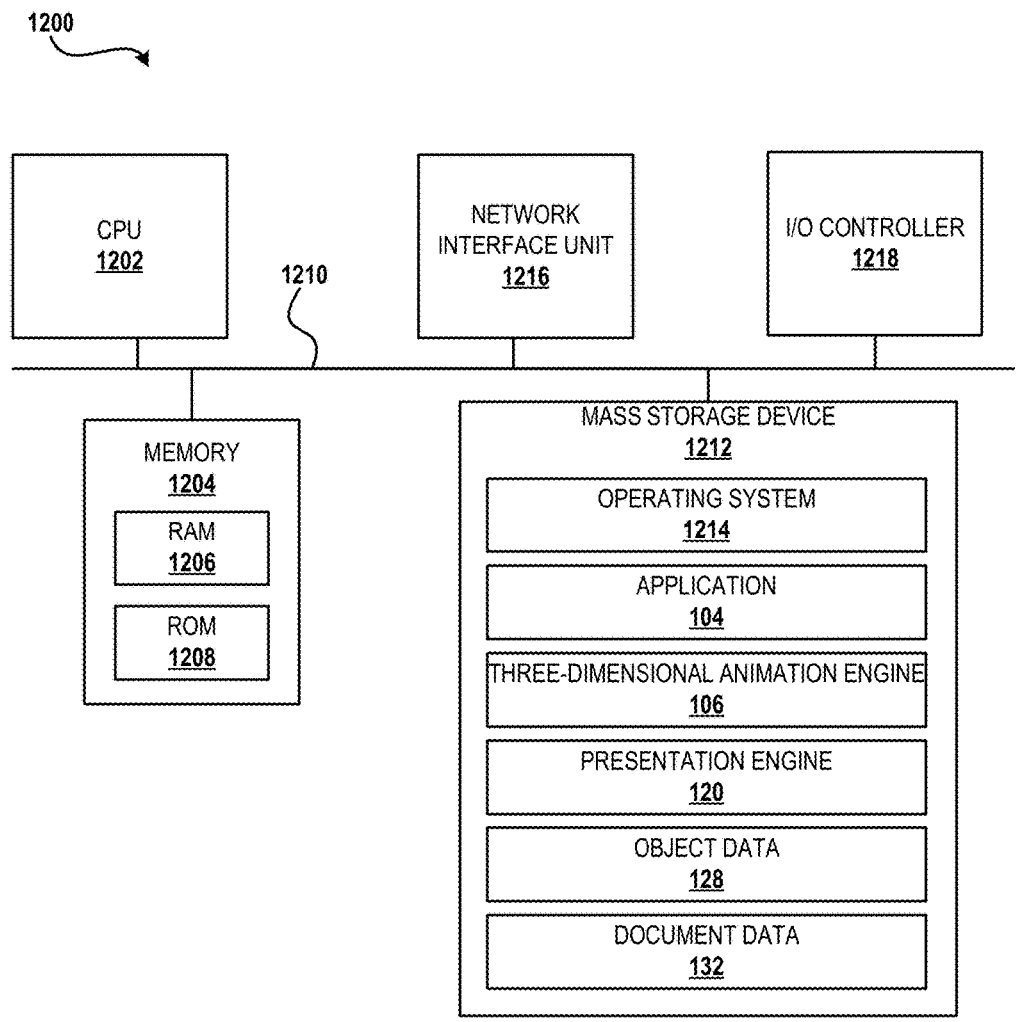
FIG. 12 shows additional details of an example computer architecture for executing the systems, methods, and techniques disclosed herein.

FIG. 12 shows additional details of an example computer architecture 1200 for a computer capable of executing the application 104, the 3D animation engine 106, the presentation engine 120, and/or any program components thereof as described herein. Thus, the computer architecture 1200 illustrated in FIG. 12 illustrates an architecture for a client device, a server computer, or network of server computers, or any other types of computing devices suitable for implementing the functionality described herein. The computer architecture 1200 may be utilized to execute any aspects of the software components presented herein.

The computer architecture 1200 illustrated in FIG. 12 includes a central processing unit 1202 ("CPU"), a system memory 1204, including a random-access memory 1206 ("RAM") and a read-only memory ("ROM") 1208, and a system bus 1210 that couples the memory 1204 to the CPU 1202. A basic input/output system containing the basic routines that help to transfer information between elements within the computer architecture 1200, such as during startup, is stored in the ROM 1208. The computer architecture 1200 further includes a mass storage device 1212 for storing an operating system 1214, other data, and one or more application programs. The mass storage device 1212 may further include one or more of the application 104, the 3D animation engine 106, the presentation engine 120, the object data 128, and/or the document data 132.

The mass storage device 1212 is connected to the CPU 1202 through a mass storage controller (not shown) connected to the bus 1210. The mass storage device 1212 and its associated computer-readable media provide non-volatile storage for the computer architecture 1200. Although the description of computer-readable media contained herein refers to a mass storage device, such as a solid-state drive, a hard disk or CD-ROM drive, it should be appreciated by those skilled in the art that computer-readable media can be any available computer storage media or communication media that can be accessed by the computer architecture 1200.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner so as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

By way of example, and not limitation, computer storage media may include volatile and non-volatile, removable and non-removable media implemented in any method or technology for storage of information such as computer-readable instructions, data structures, program modules or other data. For example, computer media includes, but is not limited to, RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer architecture 1200. For purposes of the claims, the phrase "computer storage medium," "computer-readable storage medium" and variations thereof, does not include waves, signals, and/or other transitory and/or intangible communication media, per se.

According to various techniques, the computer architecture 1200 may operate in a networked environment using logical connections to remote computers through a network (not shown). The computer architecture 1200 may connect to the network through a network interface unit 1216 connected to the bus 1210. It should be appreciated that the network interface unit 1216 also may be utilized to connect to other types of networks and remote computer systems. The computer architecture 1200 also may include an input/output controller 1218 for receiving and processing input from a number of other devices, including a keyboard, mouse, or electronic stylus (not shown in FIG. 12). Similarly, the input/output controller 1218 may provide output to a display screen, a printer, or other type of output device (also not shown in FIG. 12).

It should be appreciated that the software components described herein may, when loaded into the CPU 1202 and executed, transform the CPU 1202 and the overall computer architecture 1200 from a general-purpose computing system into a special-purpose computing system customized to facilitate the functionality presented herein. The CPU 1202 may be constructed from any number of transistors or other discrete circuit elements, which may individually or collectively assume any number of states. More specifically, the CPU 1202 may operate as a finite-state machine, in response to executable instructions contained within the software modules disclosed herein. These computer-executable instructions may transform the CPU 1202 by specifying how the CPU 1202 transitions between states, thereby transforming the transistors or other discrete hardware elements constituting the CPU 1202.

Encoding the software modules presented herein also may transform the physical structure of the computer-readable media presented herein. The specific transformation of physical structure may depend on various factors, in different implementations of this description. Examples of such factors may include, but are not limited to, the technology used to implement the computer-readable media, whether the computer-readable media is characterized as primary or secondary storage, and the like. For example, if the computer-readable media is implemented as semiconductor-based memory, the software disclosed herein may be encoded on the computer-readable media by transforming the physical state of the semiconductor memory. For example, the software may transform the state of transistors, capacitors, or other discrete circuit elements constituting the semiconductor memory. The software also may transform the physical state of such components in order to store data thereupon.

As another example, the computer-readable media disclosed herein may be implemented using magnetic or optical technology. In such implementations, the software presented herein may transform the physical state of magnetic or optical media, when the software is encoded therein. These transformations may include altering the magnetic characteristics of particular locations within given magnetic media. These transformations also may include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer architecture 1200 in order to store and execute the software components presented herein. It also should be appreciated that the computer architecture 1200 may include other types of computing devices, including hand-held computers, embedded computer systems, personal digital assistants, and other types of computing devices known to those skilled in the art. It is also contemplated that the computer architecture 1200 may not include all of the components shown in FIG. 12, may include other components that are not explicitly shown in FIG. 12, or may utilize an architecture completely different than that shown in FIG. 12.

Example Clauses

The disclosure presented herein may be considered in view of the following clauses.

Example Clause A, a computer-implemented method for generating an animation of an object, comprising: receiving object data defining a three-dimensional model of the object; causing a display of an animation preset graphical user interface (GUI) for showing a plurality of animation presets that are deployable to animate the object, wherein individual animation presets, of the plurality of animation presets, define individual combinations of animation features that include one or more of a translation of the object, a rotation of the object, or an opacity of the object; receiving a selection of a particular animation preset defining a selected combination of two or more of the animation features; receiving an input indicating an intensity level with which to render the particular animation preset, wherein the intensity level defines at least one of acceleration parameters or magnitude parameters for the selected combination of the animation features; and generating, based on the object data, a rendering of the object progressing through the selected combination of the animation features in accordance with the intensity level.

Example Clause B, the computer-implemented method of Example Clause A, further comprising: receiving an indication of an animation space for generating the rendering of the object; and based on the indication, toggling between: generating the rendering of the object with respect to a global coordinate system defined by a viewing space of an application, and generating the rendering of the object with respect to a local coordinate system defined by the object data defining the three-dimensional model of the object.

Example Clause C, the computer-implemented method of any of Example Clauses A through B, further comprising: receiving an indication of trigger criteria associated with triggering a display of the rendering of the object within a viewing space of a presentation application; monitoring presentation activity with respect to the presentation application to determine when the presentation activity satisfies the trigger criteria; and causing the rendering of the object to be displayed within the viewing space of the presentation application in response to determining that the presentation activity satisfies the trigger criteria.

Example Clause D, the computer-implemented method of any of Example Clauses A through C, wherein the magnitude parameters define at least one of a distance of the translation of the object, a velocity of the translation, an angle of the rotation of the object, or an angular velocity of the rotation.

Example Clause E, the computer-implemented method of any of Example Clauses A through D, wherein the selected combination of the animation features includes an opacity animation feature that causes a plurality of opacity adjustments for the object during the rendering, and a rotation animation feature that causes a plurality of rotational adjustments for the object during the rendering, wherein the plurality of opacity adjustments at least partially overlap with the plurality of rotational adjustments.

Example Clause F, the computer-implemented method of Example Clause E, wherein the selected combination of the animation features further includes a translation animation feature that causes a plurality of translational adjustments for the object during the rendering, and wherein the opacity animation feature causes an opacity level of the object to increase as the plurality of translational adjustments approach a viewing space perspective.

Example Clause G, the computer-implemented method of any of Example Clauses A through F, wherein the selected combination of the animation features further includes a translation animation feature that causes a plurality of translational adjustments for the object during the rendering, and a rotation animation feature that causes a plurality of rotational adjustments for the object during the rendering, wherein the plurality of translational adjustments at least partially overlaps with the plurality of rotational adjustments.

Example Clause H, the computer-implemented method of any of Example Clauses A through G, wherein the selected combination of the animation features further includes a deformation animation feature that causes at least one deformational adjustment for the object during the rendering, and wherein the deformational adjustments include at least one of compressing the object along an axis of translation or centrifugally elongating the object from an axis of rotation.

Example Clause I, the computer-implemented method of any of Example Clauses A through H, wherein the rendering begins with an initial frame in which the object is shown at a particular position and a particular orientation with respect to a global coordinate system, and wherein the rendering terminates with a terminal frame that is substantially identical to the initial frame.

Example Clause J, a computer-implemented method for rendering three-dimensional animations in association with two-dimensional work pages, the method comprising: receiving document data that defines one or more two-dimensional work pages; receiving object data that defines a three-dimensional model of an object; displaying an animation preset graphical user interface (GUI) for showing a plurality of animation presets that are deployable to superimpose animations of the three-dimensional model of the object over the one or more two-dimensional work pages; receiving an input indicating a location on an individual two-dimensional work page, of the one or more two-dimensional work pages, to animate the three-dimensional model of the object; responsive to the input, superimposing a three-dimensional scene box onto the individual two-dimensional work page at the location; receiving a selection of a particular animation preset that defines a combination of animation features for animating the three-dimensional model of the object within the three-dimensional scene box; and generating, based on the object data, a rendering of the object progressing through the combination of animation features within the three-dimensional scene box.

Example Clause K, the computer-implemented method of Example Clause J, further comprising: persisting animation parameters into the document data that defines the one or more two-dimensional work pages, wherein the animation parameters define at least one of a selected intensity level preset or the combination of animation features.

Example Clause L, the computer-implemented method of any one of Example Clauses J through K, wherein the animation preset GUI further shows a set of intensity level presets that define at least one of acceleration parameters or magnitude parameters for the combination of animation features.

Example Clause M, the computer-implemented method of any one of Example Clauses J through L, further comprising receiving layer parameters that indicate a layering order of the rendering of the object with respect to a two-dimensional object that is located on the two-dimensional work page.

Example Clause N, the computer-implemented method of any one of Example Clauses J through M, wherein the layer parameters cause a first portion of the rendering of the object to be obscured by the two-dimensional object and a second portion of the rendering of the object to be visibly-superimposed over the two-dimensional object.

Example Clause O, the computer-implemented method of any one of Example Clauses J through N, wherein the object data defines a local coordinate system that corresponds to the three-dimensional model of the object, and wherein the rendering of the object is generated with respect to a global coordinate system defined by a viewing space.

Example Clause P, the computer-implemented method of any one of Example Clauses J through O, further comprising: determining first trigger criteria associated with triggering display of the rendering of the object in accordance with a first intensity level; determining second trigger criteria associated with triggering a display of the rendering of the object in accordance with a second intensity level; and monitoring presentation activity with respect to the individual two-dimensional work page to determine whether to: generate the rendering of the object in accordance with the first intensity level in response to the present activity satisfying the first trigger criteria, or generate the rendering of the object in accordance with the second intensity level in response to the present activity satisfying the second trigger criteria.

Example Clause Q, the computer-implemented method of any one of Example Clauses J through P, further comprising determining an intensity level with which to render the particular animation preset, wherein the intensity level defines at least one of acceleration parameters or magnitude parameters for the selected combination of the animation features.

Example Clause R, the computer-implemented method of any one of Example Clauses J through Q, wherein the intensity level further indicates at least one of a number of axes to translate the object along, or a number of axes to rotate the object about.

Example Clause S, a system comprising: one or more processors; a memory in communication with the one or more processors, the memory having computer-readable instructions stored thereupon which, when executed by the one or more processors, cause the client device to: receive object data defining a three-dimensional model of the object; display an animation preset graphical user interface (GUI) that shows a plurality of animation presets that are deployable to animate the object, wherein individual animation presets define individual combinations of two or more of a translation animation feature, a rotation animation feature, or an opacity animation feature; receive a selection of a particular animation preset defining a selected combination of two or more of the translation animation feature, the rotation animation feature, or the opacity animation feature; receive an input indicating an animation space for generating a rendering of the object in accordance with the particular animation preset defining the selected combination; and generate, based on the object data, the rendering of the object progressing through the selected combination within the animation space indicated by the input.

Example Clause T, the system of Example Clause S, wherein the input indicating the animation space for generating the rendering of the object toggles the rendering of the object from a viewing space corresponding to a global coordinate system to an object space corresponding to a local coordinate system.

Example Clause U, the system of any one of Example Clauses S through T, wherein the computer-readable instructions further cause the client device to: determine when presentation activity satisfies trigger criteria; and cause the rendering of the object to be displayed within a viewing space of a presentation application in response to determining that the presentation activity satisfies the trigger criteria.

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

The invention claimed is:

1. A computer-implemented method for generating an animation of an object, comprising:
   receiving document data defining a two-dimensional work page based at least in part on a global coordinate system;
   receiving object data defining a three-dimensional model of the object based at least in part on a three-dimensional local coordinate system;
   causing a display of an animation preset graphical user interface (GUI) for showing a plurality of animation presets that are deployable to animate the object, wherein individual animation presets, of the plurality of animation presets, define individual combinations of animation features;
   receiving a user input indicating a location on the two-dimensional work page to superimpose a three-dimensional scene box within which to animate the three-dimensional model of the object
   receiving a selection of a particular animation preset defining a selected combination of two or more of the animation features;
   receiving an input indicating an intensity level with which to render the particular animation preset, wherein the intensity level defines at least one of acceleration parameters or magnitude parameters for the selected combination of the animation features; and
   generating, based on the object data, a rendering of the object progressing through the selected combination of the animation features in accordance with the intensity level, wherein the rendering corresponds to at least some rotation and at least some translation of the three-dimensional model of the object with respect to the global coordinate system of the two-dimensional work page.

2. The computer-implemented method of claim 1, further comprising:
   receiving an indication of an animation space for generating the rendering of the object; and
   based on the indication, toggling between:
      generating the rendering of the object with respect to the global coordinate system, and
      generating the rendering of the object with respect to the three-dimensional local coordinate system.

3. The computer-implemented method of claim 1, further comprising:
   receiving an indication of trigger criteria associated with triggering a display of the rendering of the object within a viewing space of a presentation application;
   monitoring presentation activity with respect to the presentation application to determine when the presentation activity satisfies the trigger criteria; and
   causing the rendering of the object to be displayed within the viewing space of the presentation application in response to determining that the presentation activity satisfies the trigger criteria.

4. The computer-implemented method of claim 1, wherein the magnitude parameters define at least one of a distance of the translation of the three-dimensional model of the object, a velocity of the translation, an angle of the rotation of the three-dimensional model of the object, or an angular velocity of the rotation.

5. The computer-implemented method of claim 1, wherein the selected combination of the animation features includes at least:
an opacity animation feature that causes a plurality of opacity adjustments for the three-dimensional model of the object during the rendering, and
a rotation animation feature that causes a plurality of rotational adjustments for the three-dimensional model of the object during the rendering, wherein the plurality of opacity adjustments at least partially overlap with the plurality of rotational adjustments.

6. The computer-implemented method of claim 5, wherein the selected combination of the animation features further includes a translation animation feature that causes a plurality of translational adjustments for the three-dimensional model of the object during the rendering, and wherein the opacity animation feature causes an opacity level of the object to increase as the plurality of translational adjustments approach a viewing space perspective.

7. The computer-implemented method of claim 1, wherein the selected combination of the animation features further includes at least:
a translation animation feature that causes a plurality of translational adjustments for the object during the rendering, and
a rotation animation feature that causes a plurality of rotational adjustments for the object during the rendering, wherein the plurality of translational adjustments at least partially overlaps with the plurality of rotational adjustments.

8. The computer-implemented method of claim 1, wherein the selected combination of the animation features further includes a deformation animation feature that causes at least one deformational adjustment to the three-dimensional model of the object during the rendering, and wherein the deformational adjustments include at least one of compressing the three-dimensional model of the object along an axis of translation or centrifugally elongating the three-dimensional model of the object from an axis of rotation.

9. The computer-implemented method of claim 1, wherein the rendering begins with an initial frame in which the object is shown at a particular position and a particular orientation with respect to a global coordinate system, and wherein the rendering terminates with a terminal frame that is substantially identical to the initial frame.

10. A computer-implemented method for rendering three-dimensional animations in association with two-dimensional work pages, the method comprising:
receiving document data that defines a two-dimensional work page in association with a global coordinate system;
receiving object data that defines a three-dimensional model of an object in association with a three-dimensional local coordinate system;
displaying an animation preset graphical user interface (GUI) for showing a plurality of animation presets that are deployable to superimpose animations of the three-dimensional model of the object over the two-dimensional work page;
receiving a user input indicating a location on the two-dimensional work page to superimpose a three-dimensional scene box within which to animate the three-dimensional model of the object;
responsive to the user input, superimposing the three-dimensional scene box onto the two-dimensional work page at the location;
receiving a selection of a particular animation preset that defines a combination of animation features for animating the three-dimensional model of the object within the three-dimensional scene box; and
generating, based on the object data, a rendering of the object progressing through the combination of animation features within the three-dimensional scene box, wherein the rendering corresponds to at least some rotation and translation of the three-dimensional local coordinate system of the object data with respect to the global coordinate system of the two-dimensional work page.

11. The computer-implemented method of claim 10, further comprising:
persisting animation parameters into the document data that defines the two-dimensional work page, wherein the animation parameters define at least one of a selected intensity level preset or the combination of animation features.

12. The computer-implemented method of claim 10, wherein the animation preset GUI further shows a set of intensity level presets that define at least one of acceleration parameters or magnitude parameters for the combination of animation features.

13. The computer-implemented method of claim 10, further comprising receiving layer parameters that indicate a layering order of the rendering of the object with respect to a two-dimensional object that is located on the two-dimensional work page.

14. The computer-implemented method of claim 13, wherein the layer parameters cause a first portion of the rendering of the object to be obscured by the two-dimensional object and a second portion of the rendering of the object to be visibly-superimposed over the two-dimensional object.

15. The computer-implemented method of claim 10, further comprising:
determining first trigger criteria associated with triggering the rendering of the object in accordance with a first intensity level;
determining second trigger criteria associated with triggering the rendering of the object in accordance with a second intensity level; and
monitoring presentation activity with respect to the two-dimensional work page to determine whether to:
generate the rendering of the object in accordance with the first intensity level in response to the presentation activity satisfying the first trigger criteria, or
generate the rendering of the object in accordance with the second intensity level in response to the presentation activity satisfying the second trigger criteria.

16. The computer-implemented method of claim 10, further comprising determining an intensity level with which to render the particular animation preset, wherein the intensity level defines at least one of acceleration parameters or magnitude parameters for the selected combination of the animation features.

17. The computer-implemented method of claim 16, wherein the intensity level further indicates at least one of a number of axes to translate the object along, or a number of axes to rotate the object about.

18. A system comprising:
one or more processors;

a memory in communication with the one or more processors, the memory having computer-readable instructions stored thereupon which, when executed by the one or more processors, cause the system to:

receive object data defining a three-dimensional model of the object in association with a first coordinate system;

receive document data defining a two-dimensional work page in association with a second coordinate system;

display an animation preset graphical user interface (GUI) that shows a plurality of animation presets that are deployable to animate the three-dimensional model of the object, wherein individual animation presets define individual combinations of a translation animation feature, a rotation animation feature, or an opacity animation feature;

receive a selection of a particular animation preset defining a selected combination of two or more of the translation animation feature, the rotation animation feature, or the opacity animation feature;

receive an input indicating a location on the two-dimensional work page to animate the three-dimensional model of the object in accordance with the particular animation preset defining the selected combination; and generate, based on the object data, a rendering of the object progressing through the selected combination at the location indicated by the input, wherein the rendering corresponds to at least some rotation and translation of the three-dimensional model of the object with respect to the first coordinate system or the second coordinate system.

19. The system of claim 18, wherein the input further indicates an animation space for generating the rendering of the object, wherein the animation space is selected from a viewing space corresponding to a global coordinate system and an object space corresponding to a local coordinate system.

20. The system of claim 18, wherein the computer-readable instructions further cause the system to:

determine when presentation activity satisfies trigger criteria; and cause the rendering of the object to be displayed within a viewing space of a presentation application in response to determining that the presentation activity satisfies the trigger criteria.

* * * * *